(12) United States Patent
Judge

(10) Patent No.: US 9,279,451 B2
(45) Date of Patent: *Mar. 8, 2016

(54) COMPACT SLIDE ASSEMBLIES

(71) Applicant: Jonathan Manufacturing Corporation, Irvine, CA (US)

(72) Inventor: Ronald J. Judge, Corona, CA (US)

(73) Assignee: Jonathan Manufacturing Corporation, Irvine, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 13/852,764

(22) Filed: Mar. 28, 2013

(65) Prior Publication Data

US 2013/0259411 A1    Oct. 3, 2013

Related U.S. Application Data

(63) Continuation-in-part of application No. 13/830,842, filed on Mar. 14, 2013.

(60) Provisional application No. 61/619,837, filed on Apr. 3, 2012.

(51) Int. Cl.

| F16C 29/04 | (2006.01) |
|---|---|
| A47B 88/10 | (2006.01) |
| H05K 7/14 | (2006.01) |
| A47B 88/04 | (2006.01) |

(52) U.S. Cl.
CPC .............. *F16C 29/04* (2013.01); *A47B 88/10* (2013.01); *H05K 7/1489* (2013.01); *A47B 88/044* (2013.01); *A47B 2210/0032* (2013.01); *A47B 2210/0059* (2013.01); *A47B 2210/0081* (2013.01)

(58) Field of Classification Search
CPC ....... A47B 88/10; A47B 88/16; A47B 88/047
USPC .......... 312/333, 334.7, 334.8, 334.44–334.47
See application file for complete search history.

(56) References Cited

U.S. PATENT DOCUMENTS

| 1,736,108 A | 11/1929 | Anderson |
| 3,141,714 A | 7/1964 | Valitus |
| 3,142,517 A | 7/1964 | Ward |
| 3,292,985 A | 12/1966 | Buhrmaster |
| 3,371,968 A | 3/1968 | George |
| 4,112,539 A | 9/1978 | Hagen |

(Continued)

FOREIGN PATENT DOCUMENTS

GB    1 517 259    7/1978

*Primary Examiner* — Matthew Ing
(74) *Attorney, Agent, or Firm* — Knobbe, Martens, Olson & Bear LLP

(57) ABSTRACT

Slide assemblies that include at least an inner slide segment and an outer slide segment. Many of the slide assemblies also include an intermediate slide segment interposed between the inner slide segment and the outer slide segment. The outer slide segment is constructed from a bent piece of material having a substantially uniform wall thickness. The outer slide segment is formed to have a wall portion, an upper portion and a lower portion. Each of the upper portion and lower portion include two layers of the piece of material. A mounting assembly for a slide assembly includes at least one bracket having at least a first pin and a second pin movable relative to the first pin. The second pin can surround and slide upon the first pin and can be biased to a first position and movable to a second position relative to the first pin.

21 Claims, 27 Drawing Sheets

(56) References Cited

U.S. PATENT DOCUMENTS

| | | | |
|---|---|---|---|
| 4,549,773 A | 10/1985 | Papp et al. | |
| 4,560,212 A | 12/1985 | Papp et al. | |
| 4,749,242 A | 6/1988 | Rechberg | |
| 4,961,648 A | 10/1990 | Rock | |
| 5,033,805 A | 7/1991 | Hobbs | |
| 5,262,923 A * | 11/1993 | Batta et al. | 361/679.37 |
| 5,484,197 A | 1/1996 | Hansen et al. | |
| 5,571,256 A | 11/1996 | Good et al. | |
| 6,209,979 B1 * | 4/2001 | Fall et al. | 312/330.1 |
| 6,244,678 B1 * | 6/2001 | Dopp et al. | 312/333 |
| 6,378,968 B1 | 4/2002 | Weng | |
| 6,422,399 B1 | 7/2002 | Castillo et al. | |
| 6,547,081 B1 | 4/2003 | Kaminski | |
| 6,609,619 B2 | 8/2003 | Abbott | |
| 6,655,763 B2 * | 12/2003 | Judge et al. | 312/334.46 |
| 6,702,412 B2 | 3/2004 | Dobler et al. | |
| 6,749,275 B2 | 6/2004 | Cutler et al. | |
| 6,773,080 B2 | 8/2004 | Chen et al. | |
| 6,830,300 B2 | 12/2004 | Lauchner | |
| 6,834,923 B2 | 12/2004 | Young | |
| 6,851,773 B2 | 2/2005 | Chen et al. | |
| 6,854,816 B2 | 2/2005 | Milligan | |
| 6,860,575 B2 | 3/2005 | Chen et al. | |
| 6,883,884 B2 | 4/2005 | Chen et al. | |
| 6,926,377 B2 * | 8/2005 | Lammens et al. | 312/333 |
| 6,935,710 B2 * | 8/2005 | Chen et al. | 312/333 |
| 6,962,397 B2 | 11/2005 | Dobler et al. | |
| 6,976,745 B2 | 12/2005 | Dobler et al. | |
| 6,986,557 B2 | 1/2006 | Kellenberger et al. | |
| 7,090,319 B2 * | 8/2006 | Milligan et al. | 312/334.46 |
| 7,134,802 B2 | 11/2006 | Doerr et al. | |
| 7,281,694 B2 * | 10/2007 | Allen et al. | 248/244 |
| 7,303,361 B1 | 12/2007 | Lane | |
| 7,318,532 B1 | 1/2008 | Lee et al. | |
| 7,357,362 B2 * | 4/2008 | Yang et al. | 248/221.11 |
| 7,364,244 B2 | 4/2008 | Sandoval | |
| 7,452,040 B1 | 11/2008 | Burgess | |
| 7,552,899 B2 | 6/2009 | Chen et al. | |
| 7,571,968 B2 * | 8/2009 | Ji et al. | 312/333 |
| 7,604,308 B2 | 10/2009 | Tseng et al. | |
| 7,641,297 B2 | 1/2010 | Huang | |
| 7,648,214 B2 * | 1/2010 | Chen et al. | 312/334.47 |
| 7,708,359 B2 * | 5/2010 | Peng et al. | 312/334.47 |
| 7,726,755 B2 * | 6/2010 | Peng et al. | 312/334.46 |
| 7,731,142 B2 | 6/2010 | Chen et al. | |
| 7,798,582 B2 | 9/2010 | Yu et al. | |
| 7,946,666 B2 * | 5/2011 | Huang et al. | 312/333 |
| 7,967,399 B1 | 6/2011 | Baiza et al. | |
| 7,992,950 B2 | 8/2011 | Lauchner | |
| 8,251,465 B2 | 8/2012 | Yu et al. | |
| 8,272,783 B2 | 9/2012 | Mochizuki et al. | |
| 8,317,278 B2 | 11/2012 | Enos | |
| 8,353,494 B2 | 1/2013 | Peng et al. | |
| 8,371,454 B2 | 2/2013 | Chen et al. | |
| 8,403,432 B2 | 3/2013 | Chen et al. | |
| 8,602,225 B2 * | 12/2013 | Lin et al. | 211/26 |
| 2001/0017760 A1 | 8/2001 | Baertsoen | |
| 2001/0035704 A1 | 11/2001 | Dierbeck | |
| 2001/0040203 A1 | 11/2001 | Brock et al. | |
| 2004/0056572 A1 | 3/2004 | Chen et al. | |
| 2004/0145285 A1 * | 7/2004 | Hwang et al. | 312/333 |
| 2006/0152115 A1 | 7/2006 | Dubon et al. | |
| 2008/0122333 A1 | 5/2008 | Tseng et al. | |
| 2009/0096340 A1 * | 4/2009 | Chen et al. | 312/334.46 |
| 2010/0072153 A1 | 3/2010 | Chen | |
| 2011/0135227 A1 * | 6/2011 | Chen et al. | 384/54 |
| 2012/0170878 A1 | 7/2012 | Yu et al. | |

* cited by examiner

COMPACT SLIDE ASSEMBLIES

INCORPORATION BY REFERENCE TO RELATED APPLICATIONS

Any and all priority claims identified in the Application Data Sheet, or any correction thereto, are hereby incorporated by reference herein and made a part of the present disclosure.

BACKGROUND OF THE INVENTION

1. Field of the Invention

The present invention generally relates to slide assemblies. In particular, the present invention relates to slide assemblies having a compact cross-sectional size.

2. Description of the Related Art

Slide assemblies are often used to support a computer server within an enclosure or rack. The slide assembly permits the server to be extended from the rack to promote access to the server for maintenance, replacement or the like. The server enclosure or rack typically includes a vertical support rail at each corner. A pair of slide assemblies is mounted to the vertical support rails on opposing sides of the enclosure. The pair of slide assemblies movably supports opposing sides of a computer server.

The vertical support rails of the server rack typically include a plurality of openings, or mounting holes, spaced along the height of the support rail, which permit the slide assemblies to be coupled to the vertical support rails at any of a number of possible locations. Typically, a bracket will be connected to each end of the slide assembly and act as an interface between the slide assembly and the vertical support rails of the rack.

Although slide assemblies have been in use for a significant period of time, there is a demand for continued improvement in the design and operation of slide assemblies, especially in slide assemblies intended for use in computer server or other electronic equipment applications. For example, there is a constant push to reduce the cross-sectional size of the slide assemblies, while retaining functionality or even improving the functionality of the slide assemblies. In addition, there is a demand for improved mounting arrangements, which permit the slide assemblies to be mounted to a server rack. Often, it is desirable for the mounting arrangements to mount to the server rack without the use of tools and, in some cases, to have a single mounting arrangement that can be connected to multiple types of server racks.

SUMMARY OF THE INVENTION

The systems, methods and devices described herein have innovative aspects, no single one of which is indispensable or solely responsible for their desirable attributes. Without limiting the scope of the claims, some of the advantageous features will now be summarized.

An embodiment involves a slide assembly, which has an outer slide segment constructed from a bent piece of material having a single wall thickness. The outer slide segment has a wall portion, an upper portion and a lower portion. The upper and lower portions are separated from one another by the wall portion and each of the upper and lower portions define a bearing surface. Each of the upper and lower portions comprise two layers of the piece of material such that an effective wall thickness of the upper and lower portions is greater than a wall thickness of the wall portion extending between the upper and lower portions. At least one intermediate slide segment is telescopically engaged with the outer slide segment. The intermediate slide segment(s) have a first bearing surface and a second bearing surface. An inner slide segment is telescopically engaged with the at least one intermediate slide segment. The inner slide segment has a first bearing surface and a second bearing surface. The first and second bearing surfaces of each slide segment carry a load applied by the other slide segments.

An embodiment involves a slide assembly, which has an outer slide segment having a wall portion, an upper portion and a lower portion. The upper and lower portions are separated from one another by the wall portion and each of the upper and lower portions define a bearing surface. At least one intermediate slide segment is telescopically engaged with the outer slide segment. The at least one intermediate slide segment has a wall portion, an upper portion and a lower portion. Each of the upper portion and the lower portion define a bearing surface. An inner slide segment is telescopically engaged with the at least one intermediate slide segment. The inner slide segment has a first bearing surface and a second bearing surface. The first and second bearing surfaces of each slide segment carry a load applied by the other slide segments. A mounting assembly includes a first bracket and a second bracket. One of the first and second brackets is movable relative to the outer slide segment. Each of the first and second brackets includes at least one pin assembly, having a first pin and a second pin that is movable relative to the first pin. The second pin is biased to a first position relative to the first pin and is movable to a second position relative to the first pin.

BRIEF DESCRIPTION OF THE DRAWINGS

These and other features, aspects and advantages of the present slide assemblies are described herein with reference to drawings of certain preferred embodiments, which are provided for the purpose of illustration and not limitation. Throughout the drawings, reference numbers can be reused to indicate general correspondence between reference elements. The drawings are provided to illustrate example embodiments described herein and are not intended to limit the scope of the disclosure. The drawings contain twenty-seven (27) figures.

DETAILED DESCRIPTION OF THE PREFERRED EMBODIMENTS

Figure 1:
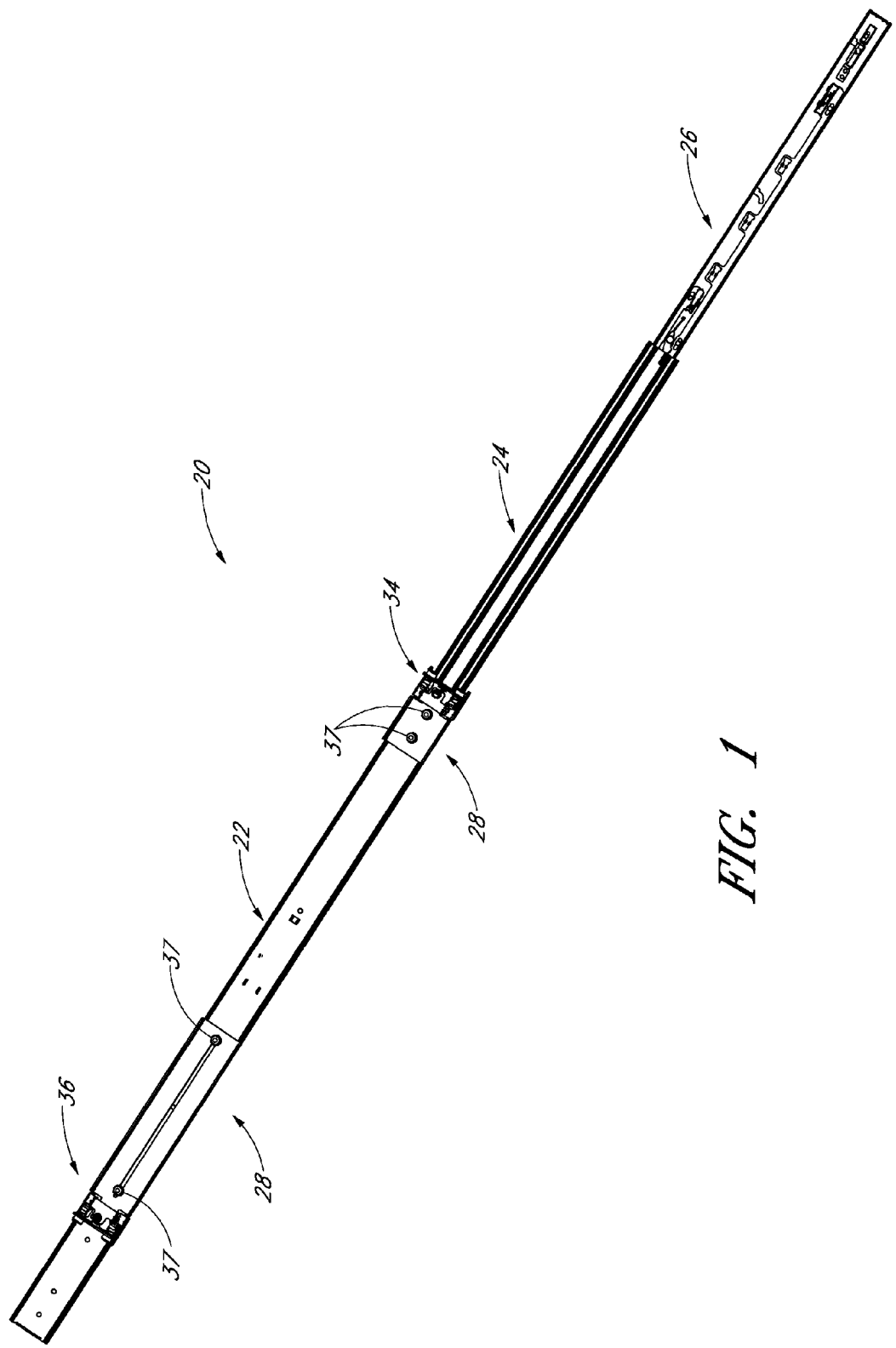
FIG. 1 is a perspective view of a first side (outside) of a first slide assembly having an outer slide segment, an intermediate slide segment and an inner slide segment.
Figure 2:
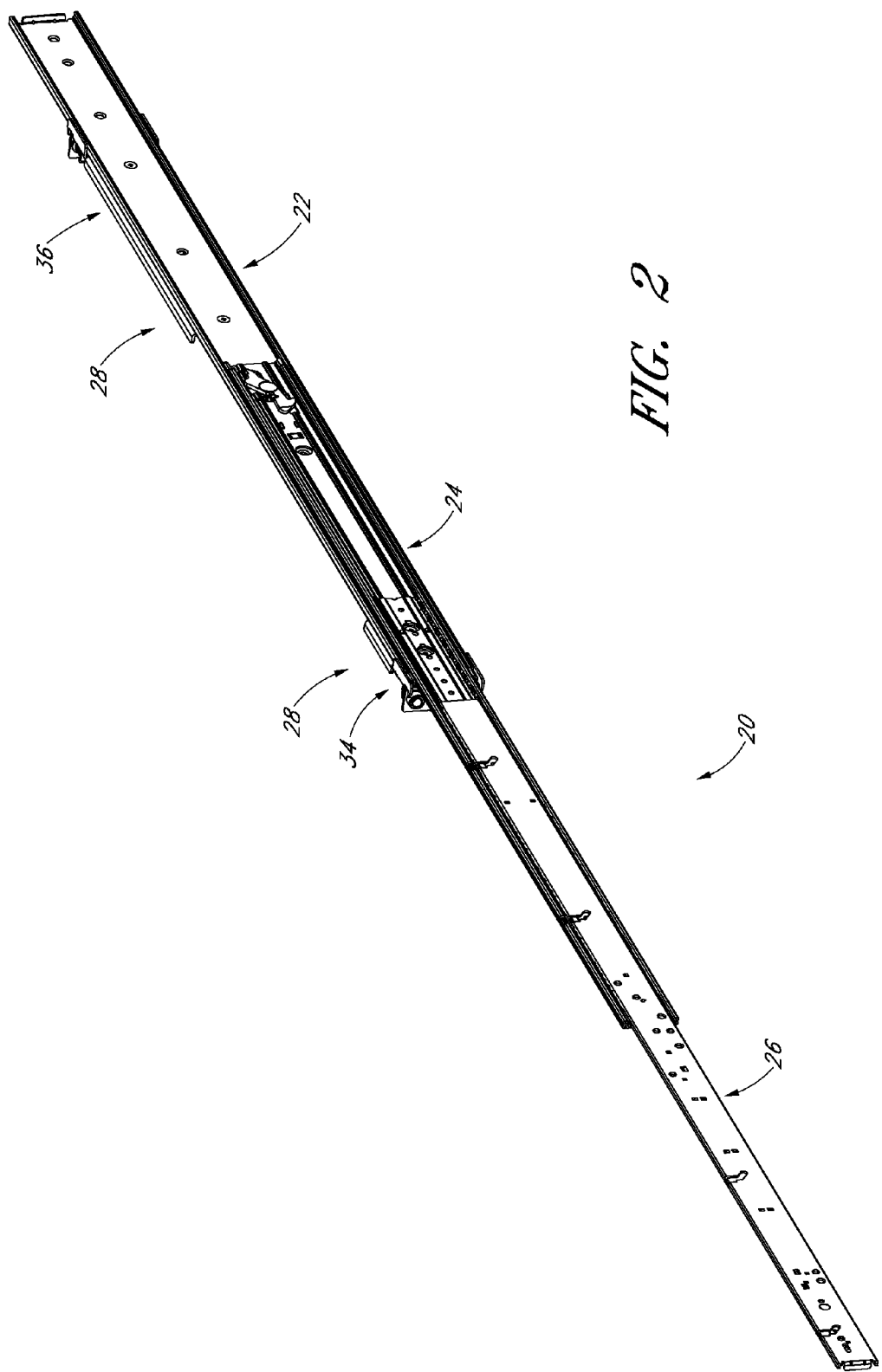
FIG. 2 is a perspective view of a second side (inside) of the slide assembly of FIG. 1.
Figure 3:
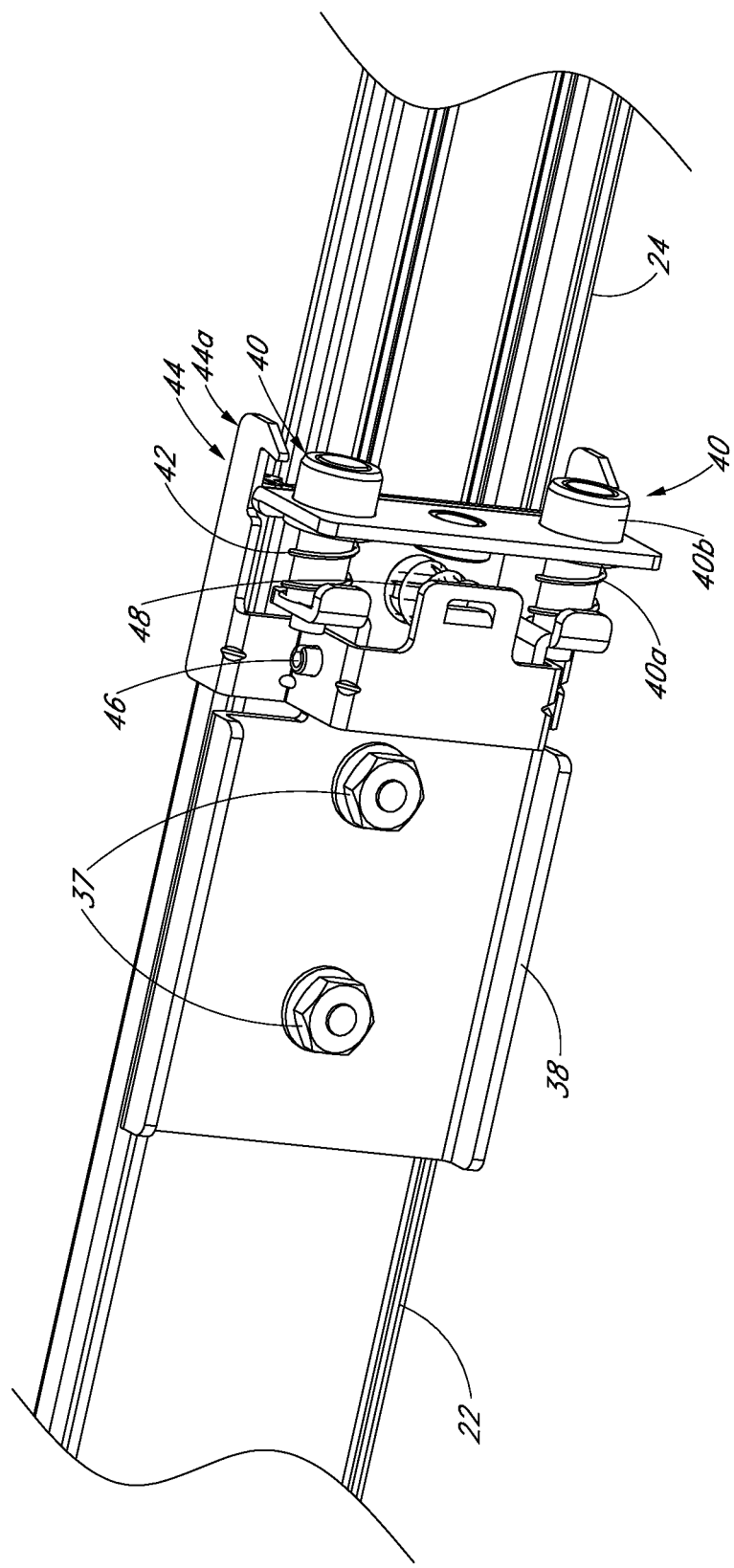
FIG. 3 is a perspective view of an intermediate portion of the slide assembly of FIG. 1 illustrating a mounting bracket located at a forward end of the outer slide segment.
Figure 4:
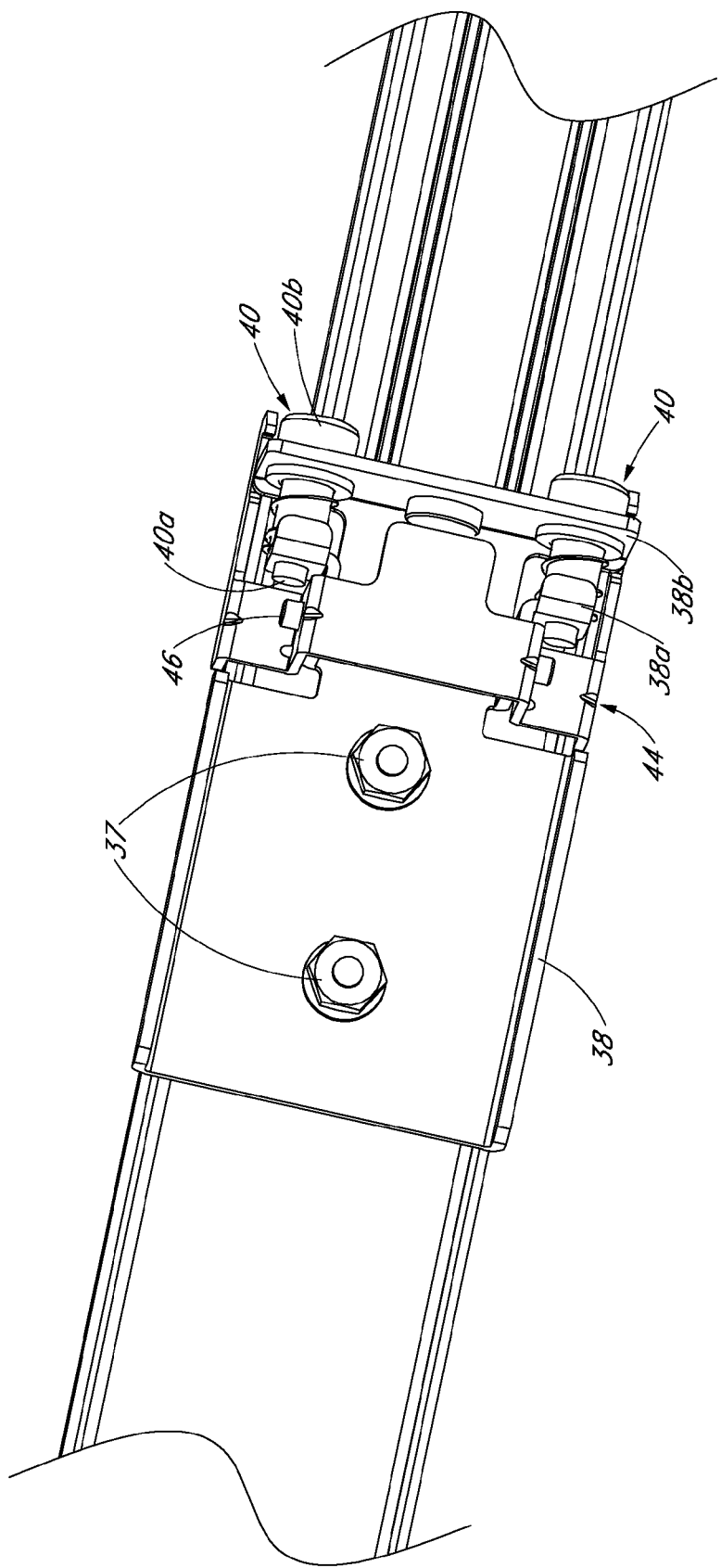
FIG. 4 is another perspective view of the mounting bracket of FIG. 3.
Figure 5:
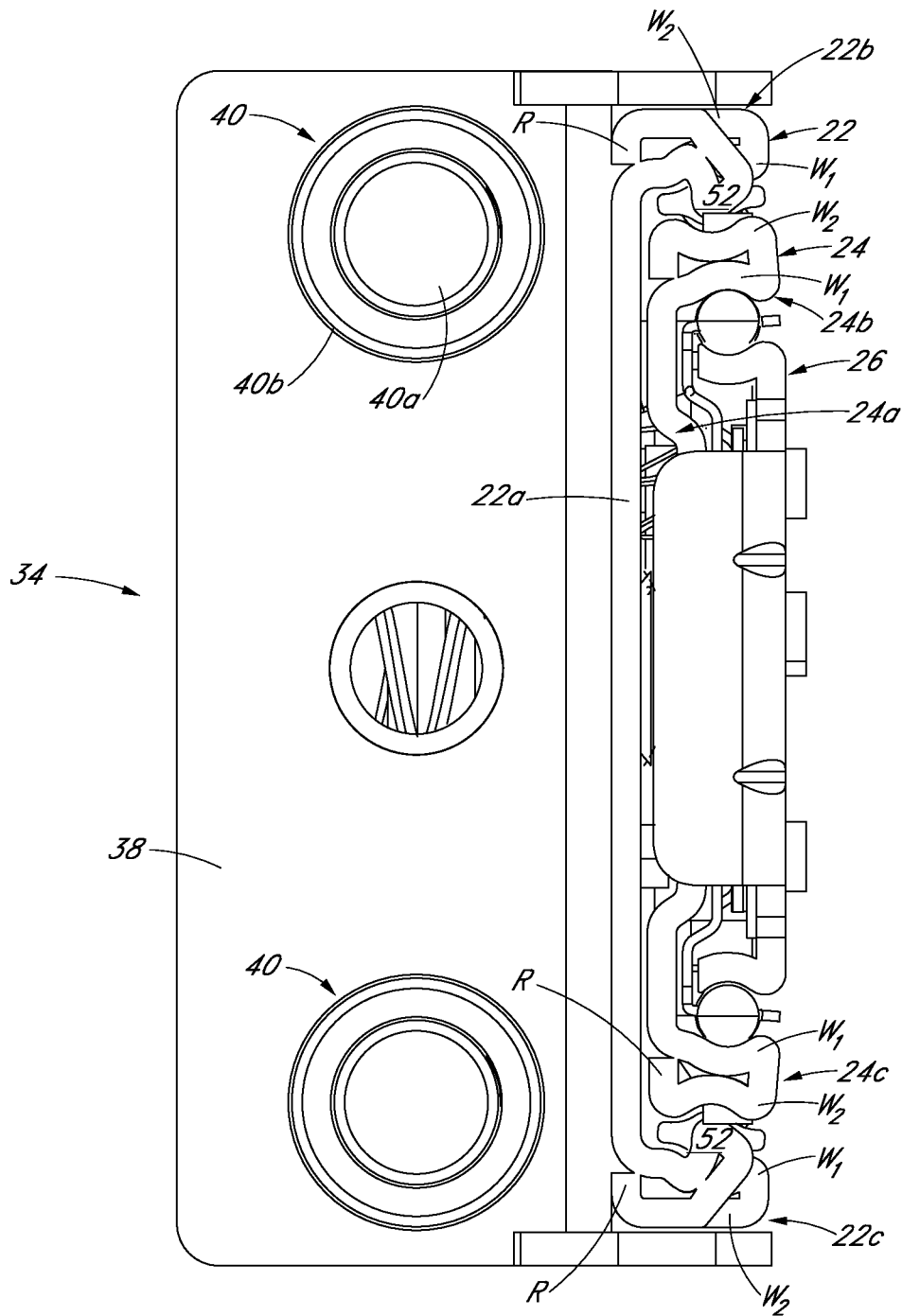
FIG. 5 is a front view the slide assembly of FIG. 1.
Figure 6:
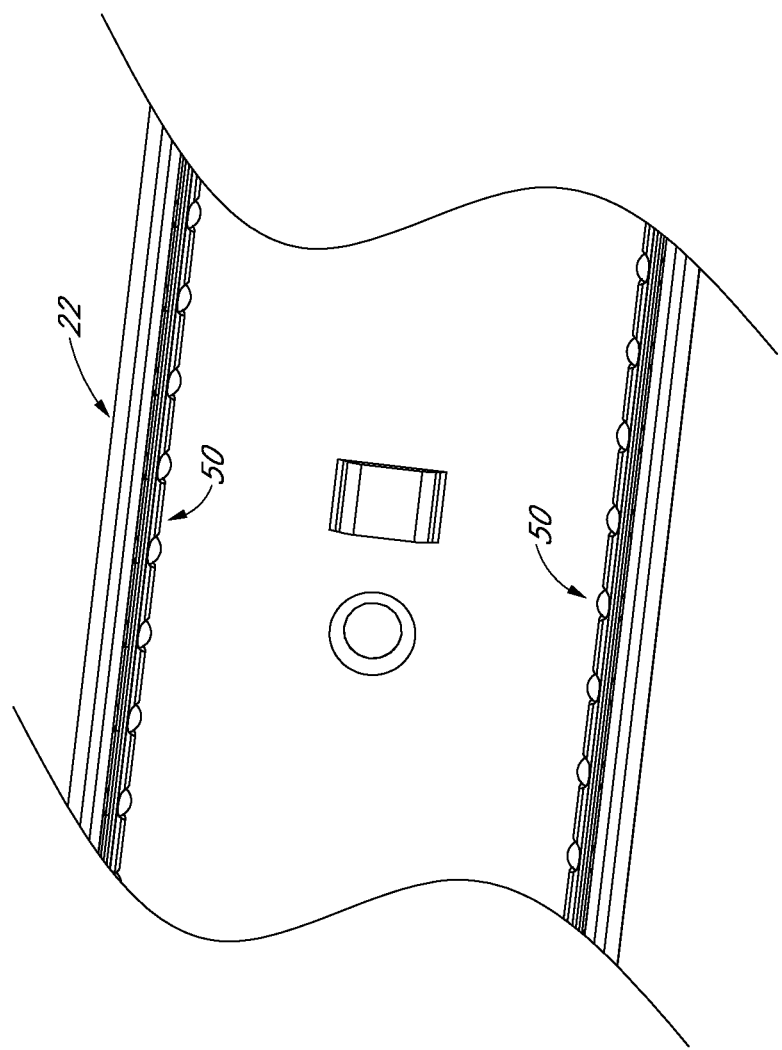
FIG. 6 is a side view of the inside of the outer slide segment of the slide assembly of FIG. 1, with the intermediate slide segment removed to show bearing assemblies.
Figure 7:
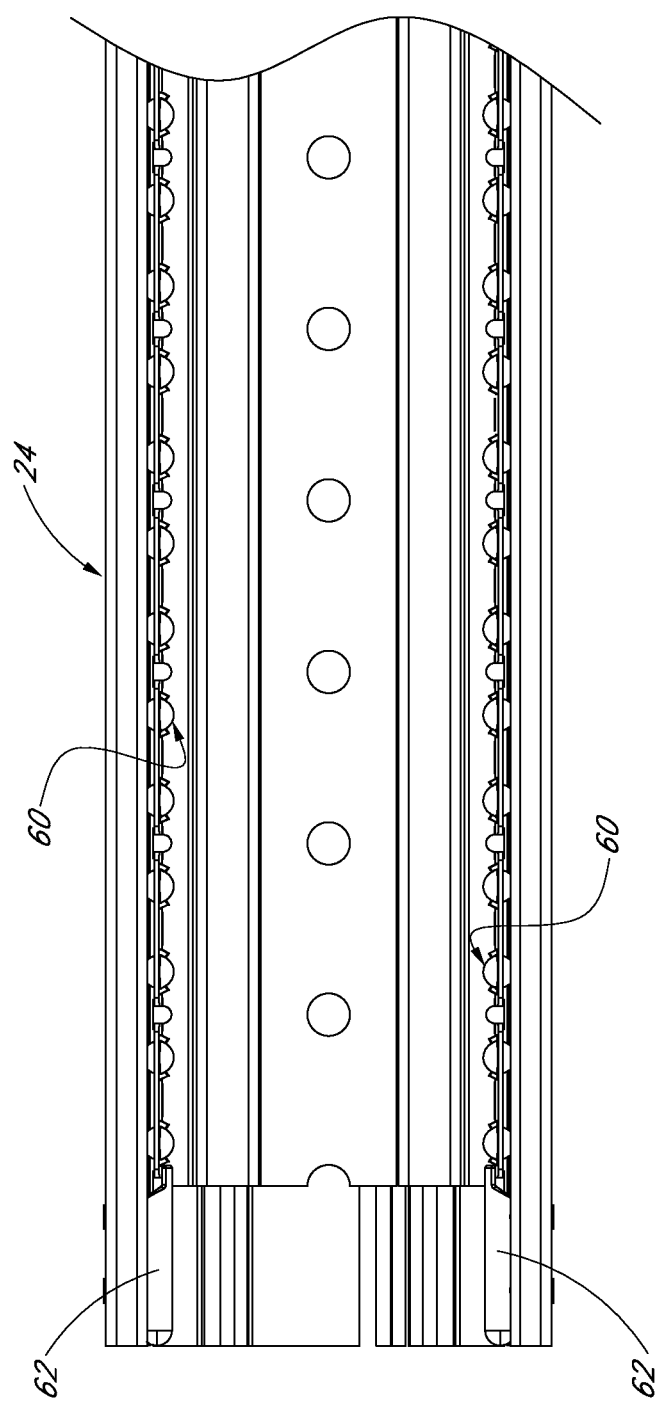
FIG. 7 is a side view of an inside of the inner slide segment of the slide assembly of FIG. 1, with the inner slide segment removed to show a bearing assembly.
Figure 8:
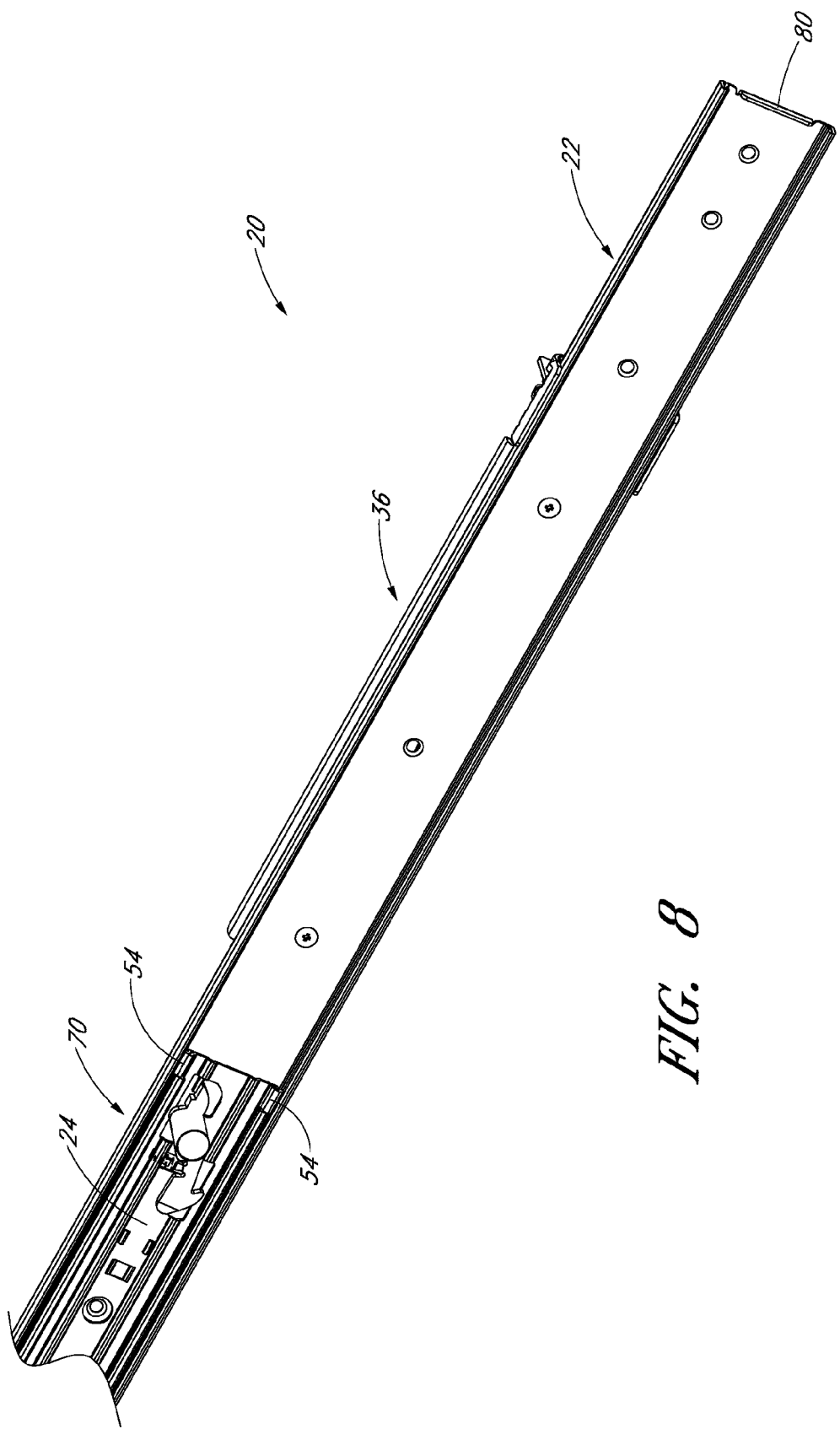
FIG. 8 is a perspective view of an inside of a rearward portion of the slide assembly of FIG. 1.
Figure 9:
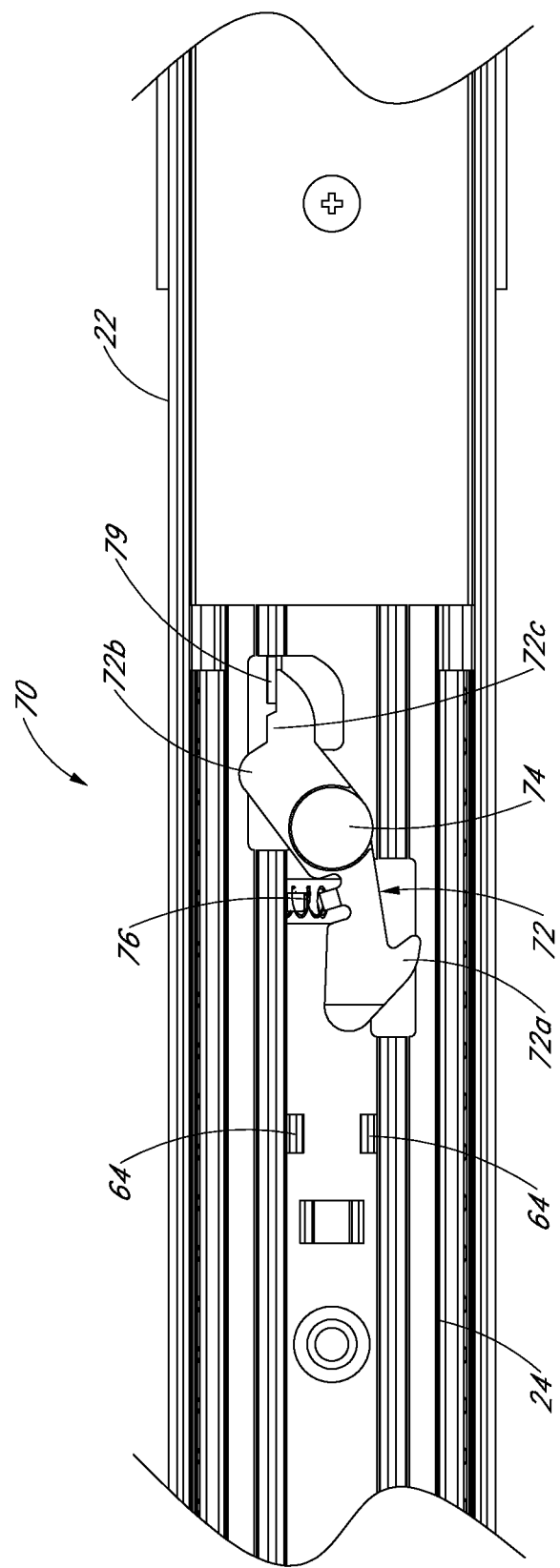
FIG. 9 is a side view of an inside of an intermediate portion of the slide assembly of FIG. 1.
Figure 10:
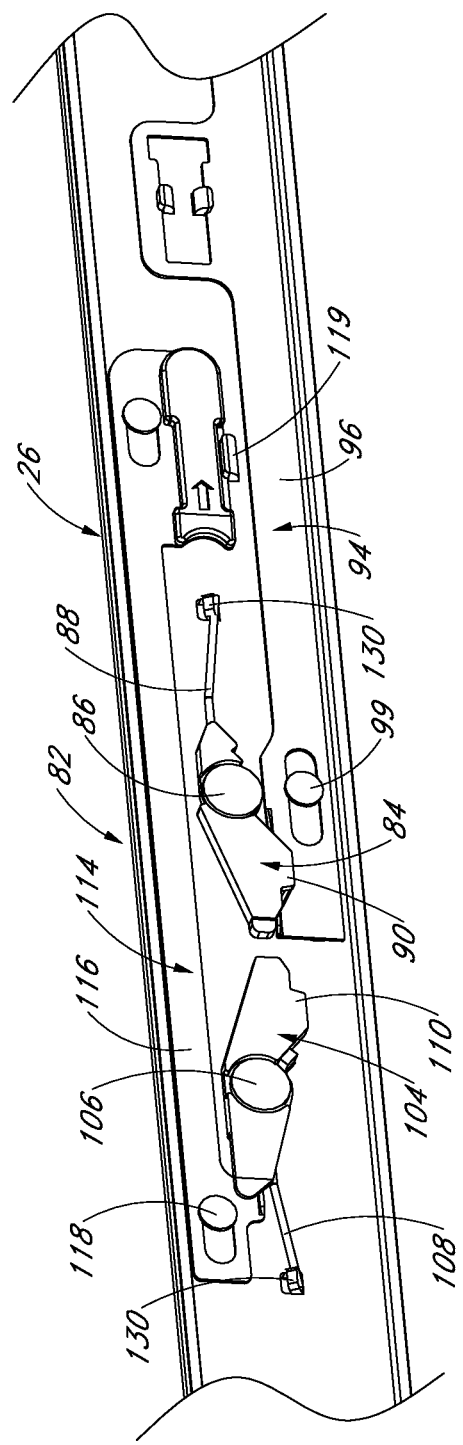
FIG. 10 is a side view of an outside of a forward end of the inner slide segment of the slide assembly of FIG. 1, with the intermediate slide segment removed to show a locking mechanism.
Figure 11:
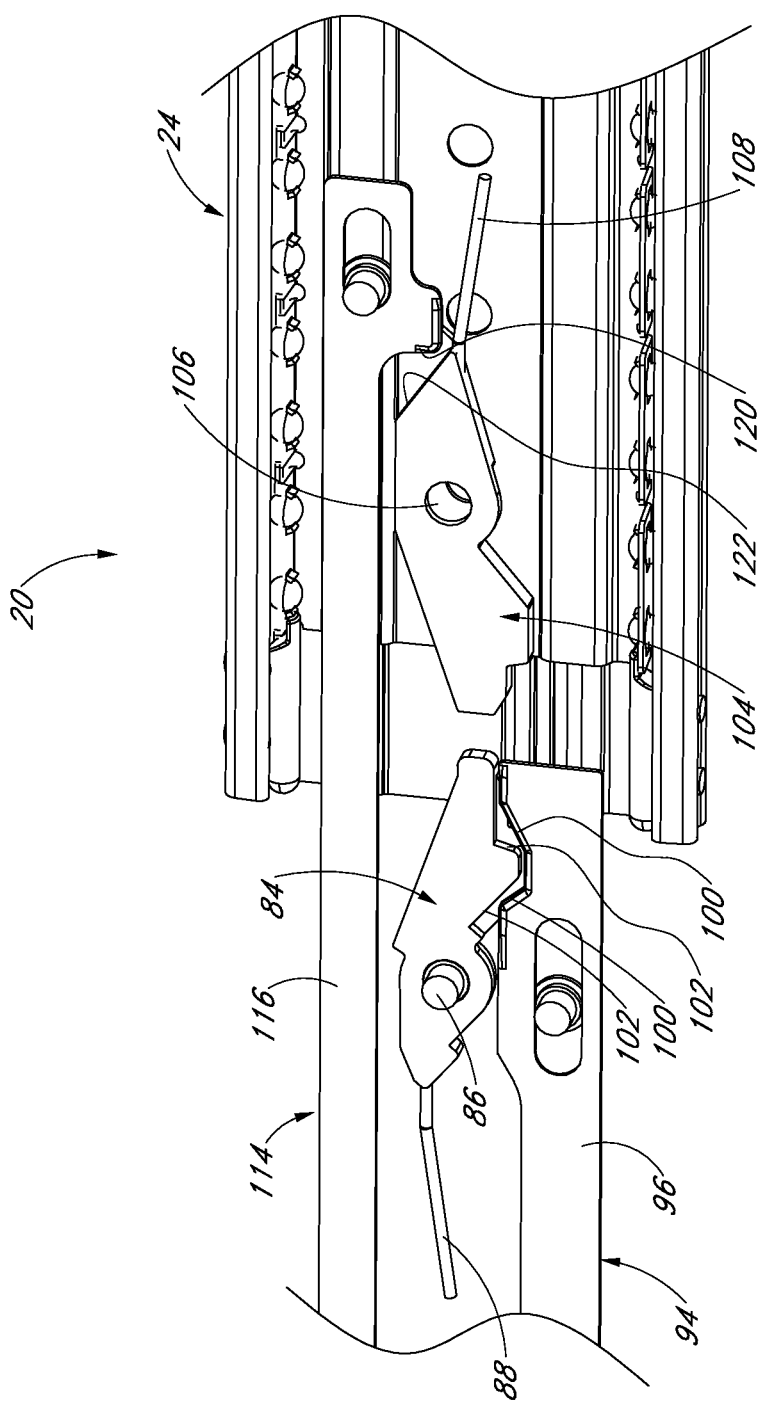
FIG. 11 is a perspective view of the locking mechanism of FIG. 10 viewed from the inside of the slide assembly with the inner slide segment removed to show the locking mechanism.
Figure 12:
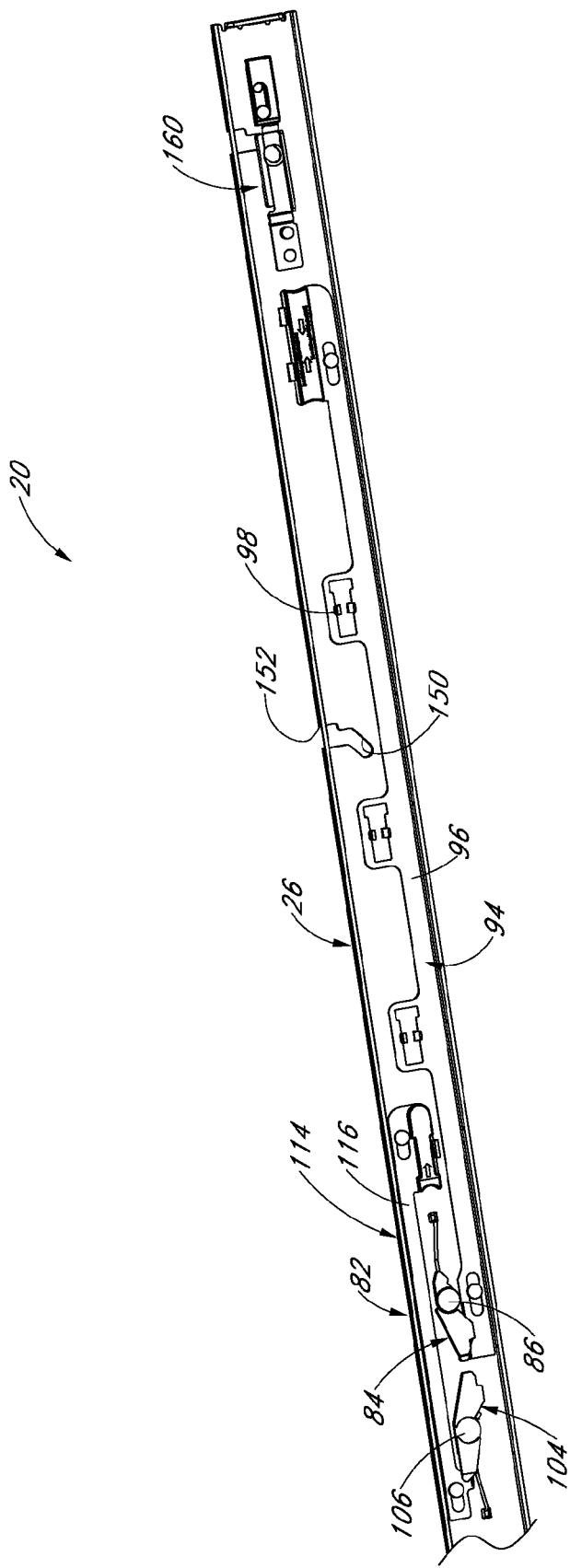
FIG. 12 is a side view of a forward portion of the slide assembly of FIG. 1, with the intermediate slide segment removed to show a locking mechanism and release mechanism of the inner slide segment.
Figure 13:
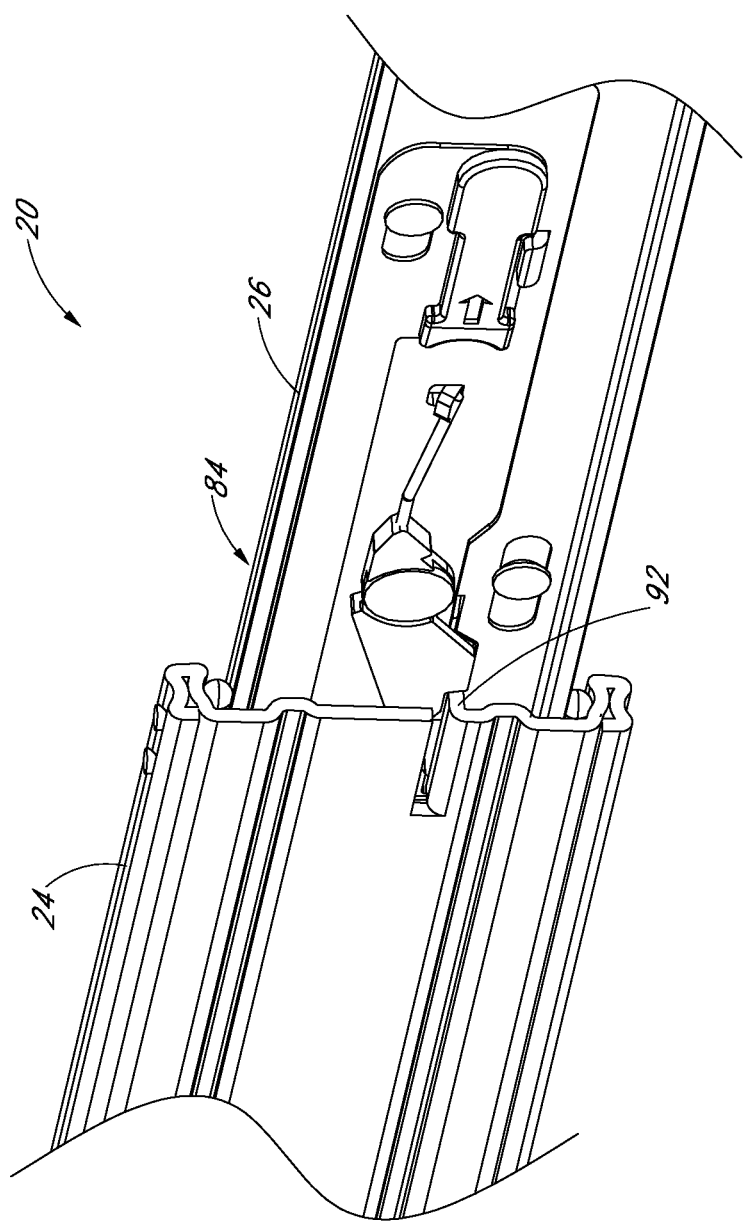
FIG. 13 is a perspective view of a forward end of the intermediate segment of the slide assembly of FIG. 1.
Figure 14:
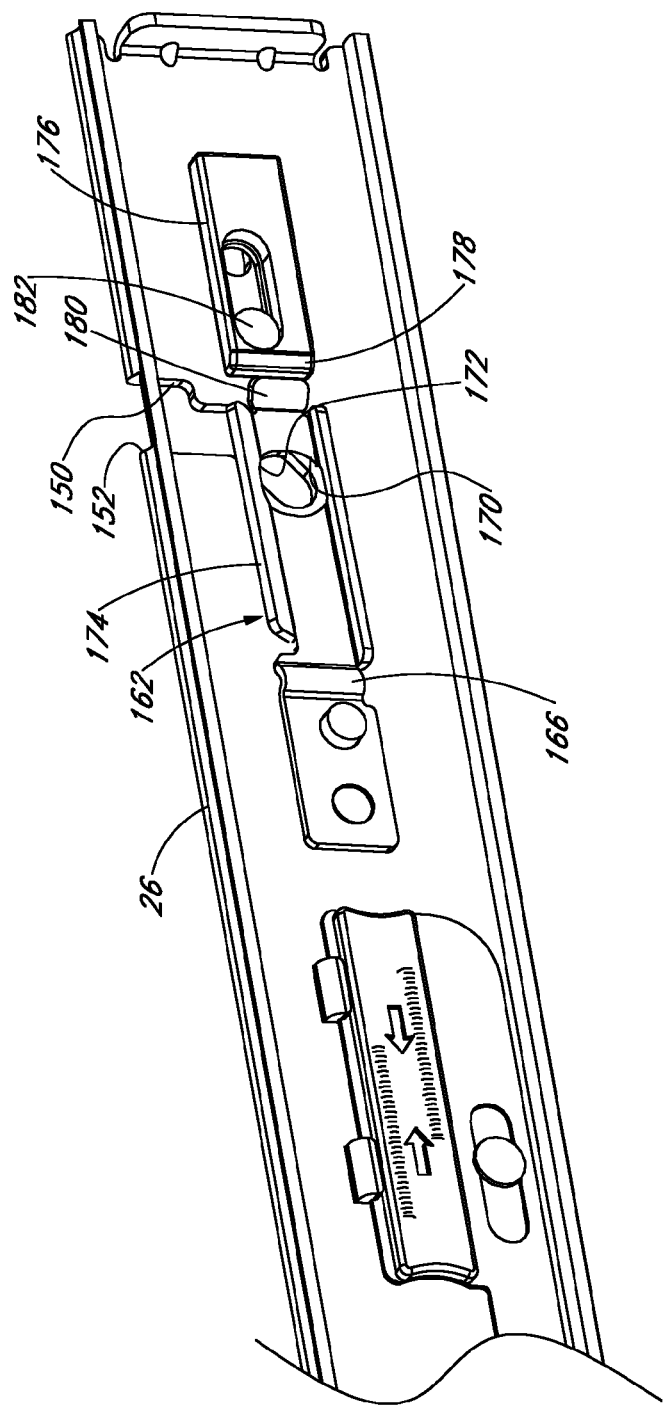
FIG. 14 is a side view of an outside of a forward end of the inner slide segment of the slide assembly of FIG. 1.
Figure 15:
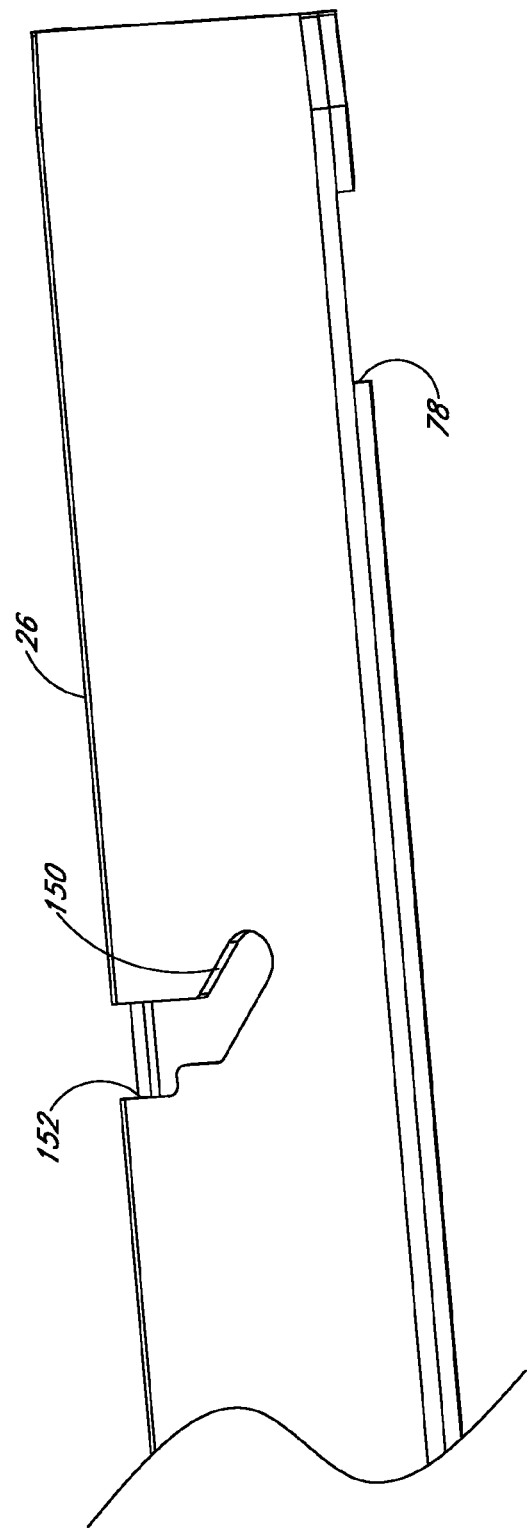
FIG. 15 is a perspective view of the bottom and inside of a rearward end of the inner slide segment of the slide assembly of FIG. 1.

Preferred embodiments of the compact slide assemblies include between two and four (or possibly more) slide segments telescopically engaged with one another to move between a closed position and an open position. The slide segments may also be referred to as channels herein. However, the use of the term "channel" does not imply any particular cross-sectional shape. The segments or channels may be any suitable shape to permit telescopic engagement between the segments. Certain preferred cross-sectional shapes are illustrated and/or described herein, some of which incorporate a double wall portion or portions. Typically, one or more slide assemblies permit one object to be supported and moved relative to another object. One object is often stationary, such as an enclosure or rack, and the other object, such as a drawer or a computer server, is movable between an open and closed position relative to the stationary object. Often, a slide assembly is provided on each side of the supported object. For convenience, the slide assembly is referred to as having an outboard side and an inboard side. The outboard side typically faces outwardly from the supported object and the inboard side faces toward the supported object. Also, the slide assembly is referred to as having a forward end and a rearward end. The slide assembly opens from the forward end and moves away from the rearward end. These, and other relative terms (top, bottom, above, below, etc.) are used for convenience and with respect to the particular orientation shown in the referenced figures and are not intended to be limiting. Thus, the slide assemblies can also be used in other orientations, or adapted for use in orientations other than those illustrated.

The preferred embodiments disclosed herein are well-suited for use in movably supporting computer servers relative to a server rack. In particular, the preferred slide assemblies have a relatively small cross-sectional size such that the space available for the computer server can be maximized. In one preferred embodiment, the width of the slide assembly is about 0.25 inches or less. The height in a 1 U application can be as small as 1.5 inches. In other arrangements, or other applications, the height can be greater. In addition, the slide assemblies are capable of supporting the load applied by the servers, and often additional loading, while still maintaining smooth extension and retraction of the slide assembly. Preferably, the outer slide segment includes a double wall portion in which the wall of the segment doubles over on itself. In some embodiments, the outer slide segment includes a double wall portion at an upper bearing surface and a double wall portion at a lower bearing surface. In some arrangements, an intermediate slide segment can also include a double wall portion at an upper bearing surface and a double wall portion at a lower bearing surface.

In some embodiments (including a 1 U embodiment and/or an embodiment having a height of about 1.5 inches or less and/or a width of about 0.25 inches or less and/or travel length of about 28 inches or more), a pair of the slide assemblies can accommodate a static load at the center of gravity of the supported object of, in some cases, at least about 225-250 lbs. in an open position and, thereafter, is functional with a cyclic working load of about 90-100 lbs. In addition, in some embodiments, the slide assemblies can accommodate each of a static front, side (lateral) load of about 56 lbs. and a static front, corner (vertical) load in an open position and, thereafter, is functional with a cyclic working load of up to about 90-100 lbs. In some configurations, the slide assemblies can pass the applicable test standards (e.g., UL 60950-1 2nd Edition) for the desired application. Such an overload capability is highly advantageous because in normal use such slide assemblies often encounter a load beyond the normal operational or cyclic working load rating. Accordingly, preferred embodiments can remain functional after experiencing static loads well beyond the operational load rating.

FIGS. 1-15 illustrate a compact slide assembly 20 having certain features, aspects and advantages of the preferred embodiments. In the illustrated arrangement, the slide assembly 20 includes three slide segments: an outer slide segment 22, an intermediate slide segment 24 and an inner slide segment 26 telescopically engaged with one another and movable between a closed position and an open position. However, in other arrangements, the slide assembly 20 may include only two segments, or more than three segments. As described in greater detail hereinafter, the slide assembly 20 can include one or more locking mechanisms that permit the slide assembly 20 to be selectively locked in one or more of a closed position, an open position, and a partially open or closed position, among others. In addition, the slide assembly 20 preferably includes bearings (ball bearings, rollers or other suitable arrangements) interposed between the slide segments 22, 24, 26 to facilitate smooth relative movement therebetween. However, in other arrangements, the segments 22, 24, 26 can slide directly on one another without any bearing arrangement.

The slide assembly 20 is configured to be secured to a stationary object, which can be a computer server rack, for example. Typically, the computer server rack includes vertical mounting rails at each corner. The slide assembly 20 includes a mounting arrangement 28 that permits the slide assembly 20 to be secured to the mounting rails of a server rack. The illustrated mounting arrangement 28 permits toolless attachment of the slide assembly 20 to the mounting rails of the computer server rack. Preferably, the mounting arrangement 28 is attached to the outer slide segment 22 such that the outer slide segment 22 is connected to the server rack and the inner slide segment 26 carries the computer server. However, in other arrangements, the inner segment may be connected to the stationary object and the outer slide segment may be connected to the movable object. Moreover, the slide assembly 20 may be connected to the server rack in any suitable manner, including tool-less attachment or attachments utilizing fasteners that require tools to assemble or disassemble.

The illustrated tool-less mounting arrangement 28 not only permits the slide assembly 20 to be coupled to the server rack, but also provides a substantial amount of length adjustment such that the mounting arrangement 28 can accommodate server racks that vary widely in depth. In particular, the mounting arrangement 28 includes a first coupling or bracket 34 at a first or forward end and a second coupling or bracket 36 at a second or rearward end. The brackets 34, 36 permit tool-less connection of the mounting arrangement 28 to the server rack. Preferably, one or both of the first and second brackets 34, 36 are movable relative to the slide assembly 20 in a lengthwise direction. In the illustrated arrangement, the first bracket 34 is secured to the slide assembly 20 at a fixed position relative to the slide assembly 20. The second bracket 36 is movable relative to the slide assembly 20 in a lengthwise direction to permit a distance between the brackets 34, 36 can be adjusted to match the distance between the forward and rearward vertical mounting rails of the computer server rack.

The mounting arrangement 28 may be secured to the outer slide segment 22 (or other portion of the slide assembly 20) by any suitable arrangement. In the illustrated arrangement, the mounting arrangement 28 is secured to the outer slide segment 22 by a plurality of fasteners 37, such as press pins, bolt-and-nut assemblies or rivets. However, other suitable fasteners or other suitable fastening arrangements, such as welding, may be used to secure the mounting arrangement 28 to the outer slide segment 22.

Each of the illustrated brackets 34, 36 include a bracket body 38 with one or more projecting pins or pin assemblies 40. Preferably, two pins are provided on the forward bracket 34 and two pin assemblies 40 are provided on the rearward bracket 36; however, other numbers of pin assemblies 40 are also possible, for example, three or four pins or pin assemblies 40. The pin assemblies 40 are configured to engage mounting holes in the vertical rails of the computer server rack. The illustrated pin assemblies 40 are generally cylindrical in shape. However, other suitable shapes may also be used. The pin 40 shape may be configured to match the shape of the server rack mounting holes or may simply be configured to be capable of engagement with the mounting holes (e.g., circular pin in a rectangular hole).

Preferably, each pin assembly 40 includes a first pin 40a and a second pin 40b that is movable relative to the first pin 40a between a first position and a second position. The second pin 40b can be biased toward the first position by a biasing member, such as a spring 42. Preferably, the first and second pins 40a, 40b are substantially cylindrical in shape. In the illustrated arrangement, the second pin 40b is annular, and surrounds and is coaxial with the first pin 40a. The first pin 40a is supported by a first flange portion 38a of the bracket body 38 and extends through an opening of a second flange portion 38b of the bracket body 38. Preferably, both the first and second flange portions 38a, 38b extend substantially perpendicular to the remainder of the bracket 38 and the length direction of the slide assembly 20. The second pin 40b also extends through the opening of the second flange portion 38b and, preferably, includes a flange that defines a stop surface, which defines a first position of the second pin 40b. The spring 42 is supported by a first flange portion 38a and biases the second pin 40b toward the first position. The second pin 40b can be moved against the biasing force of the spring 42 toward a second position to expose an end of the first pin 40a. Preferably, the rail of the mounting rack can act to move the second pin 40b from the first position toward the second position so that the first pin 40a can be inserted into a mounting opening of the rail of the mounting rack that is smaller than the outer size and shape of the second pin 40b. In some arrangements, the second pin 40b can fully retract behind the second flange portion 38b such that the face of the second flange portion 38b can contact a face of the rail of the mounting rack.

Each of the brackets 34, 36 also include a latch 44 that secures the bracket 34, 36 to the server rack. The latch 44 is pivotally coupled to the bracket body 38 to rotate about a pivot axis 46. The latch 44 pivots out of the way upon contact with the server rack to permit the pins 40 to engage the mounting holes of the server rack. Once the pins 40 are engaged, the latch 44 pivots (under the urging of biasing member 48) such that a hook portion 44a engages the server rack and secures the bracket 34, 36 in place.

Preferably, one or more of the slide segments 22, 24, 26 are formed from a sheet of metal material and bent into a final cross-sectional shape. For example, a flat sheet of steel can be bent by a roll forming process to create a slide segment 22, 24, 26 having a desired cross-sectional shape. Accordingly, preferably, one or more of the slide segments 22, 24, 26 is constructed from a material having a constant wall thickness. Preferably, the outer slide segment 22 includes a vertical wall portion 22a, an upper portion 22b and a lower portion 22c. At least one, and preferably both of the upper and lower portions 22b, 22c include two wall portions adjacent one another. In particular, a first wall portion W1 extends substantially perpendicular from the vertical wall portion 22a in a first direction and a second wall portion W2 extends from the first wall portion W1 in a second direction substantially opposite the first direction. Preferably, the second wall portion W2 is positioned outboard (i.e., above in the upper portion 22b and below in the lower portion 22c) of the first wall portion W2. The outermost edges of the outer slide segment 22 (edges of the second wall portions W2) are bent to form a return R, which is substantially perpendicular to the second wall portions W2 and extend in an inboard direction (toward the center axis of the segment 22/slide assembly 20).

Thus, each of the upper portion 22b and lower portion 22c includes a double wall portion to provide a double wall thickness portion of the overall slide segment 22. This double wall portion of the outer slide segment 22 provides increased strength and increased load carrying capacity of the slide assembly 20 by increasing the resistance to deformation of the outer slide segment 22. The second wall portions W2 could also be inboard (i.e., below in the upper portion 22b and above in the lower portion 22c) of the first wall portions W1; however, the illustrated arrangement is preferred because it is believed that the returned (bent) edges R of the second wall portions W2 contact the vertical wall portion 22a in response to a load tending to deform the upper portion 22b and/or lower portion 22a in an outboard direction to provide increased strength and resistance to deformation. This provides the slide assembly 20 with a greater load capacity for a given overall thickness of the outer slide segment 22 and the overall slide assembly 20. The loading on the outer slide segment 22 is applied at bearing surfaces defined by the upper portion 22b and lower portion 22c (the first wall portions W1 in the illustrated arrangement).

The illustrated intermediate slide segment 24 is formed with a cross-sectional shape similar to that described above with respect to the outer slide segment 22. Thus, the intermediate slide segment 24 includes a vertical wall portion 24a, an upper portion 24b and a lower portion 24c. At least one, and preferably both, of the upper portion 24b and lower portion 24c have a first wall portion W1, a second wall portion W2 (preferably outboard of the first wall portion W1) and a return R. However, in the intermediate slide segment 24, each of the first wall portion W1 and the second wall portion W2 defines bearing surfaces corresponding to the inner slide segment 26 and the outer slide segment 22, respectively. Thus, as a result of the double wall structure, and particularly the illustrated double wall structure, the intermediate slide segment 24 also exhibits increased resistance to deformation and increased load capacity. The combination of the illustrated outer slide segment 22 and intermediate slide segment 24 provides a slide assembly 20 that has a high load-carrying capacity for a given width.

Preferably, the intermediate slide segment 24 is supported for movement relative to the outer slide segment 22 by a plurality of bearings and, in particular, ball bearings 50. In the illustrated arrangement, the ball bearings 50 are held by separate bearing carriers between the respective upper and lower bearing surfaces of the outer slide segment 22 and intermediate slide segment 24. However, in other preferred embodiments, the carriers may be interconnected with a vertical wall portion to define a single carrier that carries the upper and lower ball bearings 50. Forward and rearward bearing stops 52, 54 are integrated with the segments 22, 24, such as integrated tabs punched from the body of the segment 22 or 24 and deformed into the path of the ball bearings 50.

Preferably, the inner slide segment 26 is supported for movement relative to the intermediate slide segment 24 by a plurality of bearings and, in particular, ball bearings 60. In the illustrated arrangement, the ball bearings 60 are held by a single carrier that carries the upper and lower ball bearings 60; however, separate bearing carriers respectively carrying the upper and lower bearings could also be used. Forward and rearward bearing stops 62, 64 are secured to or integrated with the segments 22, 24, such as integrated tabs punched from the body of the segment 22, 24 or 26 and positioned or deformed into the path of the ball bearings 60. Although loose ball bearings 50 and 60 are illustrated, other suitable mechanisms may be used to allow smooth movement between the individual segments 22, 24, 26, including solid bearing surfaces.

The slide assembly 20 may include multiple locks, which operate to secure segments in desirable positions relative to one another and release the segments at a desirable time during cycling of the slide assembly 20. A first lock arrangement 70 couples the inner slide segment 26 for movement with the intermediate slide segment 24 during the initial opening of the slide assembly 20 from the closed position and then decouples the inner slide segment 26 from the intermediate slide segment 24 to allow the inner slide segment 26 to continue moving toward an open position independently of the intermediate slide segment 24. The first lock arrangement 70 preferably also secures the intermediate segment 24 in an open position relative to the outer segment 22. In the illustrated arrangement, the first lock arrangement 70 is released by the inner slide segment 26 during closing of the slide assembly 20. Preferably, the first lock 70 includes a latch 72 that is rotatably supported by a pin 74. The latch 72 is biased in a first direction by a biasing member, such as a spring 76. A portion (e.g., hook 72a) of the latch 72 engages an opening 78 in the inner slide segment 26 when the inner slide segment 26 and the intermediate slide segment 24 are in a closed position overlapping one another and, preferably, with the forward ends of the segments 24, 26 substantially aligned with one another. The latch 72 also defines a surface (e.g., cam surface 72b) that engages a tab 79 in the outer slide segment 22. The tab 79 causes the latch 72 to rotate during opening motion of the intermediate slide segment 24 such that the hook 72a is withdrawn from the opening 78 to release the inner slide segment 26 from the intermediate slide segment 24. The latch 72 also includes an engagement or stop surface (e.g., shoulder 72c) that engages the tab 79 in the outer slide segment 22 when the latch 72 passes the tab 79 to secure the intermediate slide segment 24 in an open position relative to the outer slide segment 22. The latch 72 is released by the inner slide segment 26, which contacts the latch 72 when sufficiently closed relative to the intermediate slide segment 24 and rotates the latch 72 out of engagement with the tab 79. The intermediate slide segment 24 is then able to close relative to the outer slide segment 22. Rearward travel of the intermediate slide segment 24 within the outer slide segment 22 is limited by a stop, such as tab 80 of the outer slide segment 22.

The slide assembly 20 also includes a second lock arrangement 82 that operates to selectively secure the inner slide segment 26 in an open position relative to the intermediate slide segment 24 and prevents movement in at least one direction from the open position. In the illustrated arrangement, the second lock arrangement 82 inhibits movement in both directions from the open position. In other words, the second lock arrangement 82 prevents removal of the inner slide segment 26 from the intermediate slide segment 24. In addition, closing of the inner slide segment 26 is prevented until the second lock arrangement 82 is released. The second lock arrangement 82 can include a single locking mechanism or latch that accomplishes both locking functions (i.e., preventing closing and preventing removal). However, preferably, the second lock arrangement 82 includes separate locking mechanisms to perform each of these functions. Accordingly, independent release of each locking function is permitted.

The second lock arrangement 82 preferably includes a first latch 84 that is pivotally secured to the inner slide segment 26. A support shaft or pin 86 is secured to the inner slide segment 26 and rotatably supports the latch 84, which is biased to rotate about the pin 86 by a biasing member, such as a spring 88. The spring 88 biases an engagement portion 90 (e.g., a shoulder) of the latch 84 into engagement with a stop surface or tab 92 in the intermediate slide segment 24 such that the inner slide segment 26 is secured, or locked, into an open position and prevented from closing until the latch 84 is released. The illustrated tab 92 is created by a bent portion of a vertical wall of the intermediate slide segment 24. However, in other arrangements, the tab 92 could be formed by a separate component carried by the intermediate slide segment 24 or other suitable arrangements.

A release mechanism 94 operates to release the latch 84 from the tab 92 to permit the inner slide segment 26 to be retracted. The illustrated release mechanism 94 is manually actuated and extends from near the location of the latch 84 to the forward end or near the forward end of the inner slide segment 26. However, other embodiments are possible in which the release mechanism is located at the latch 84 or is automatically actuated. The illustrated release mechanism 94 includes a release body 96 slidably supported relative to the inner slide segment 26 by a support structure, such as one or more tabs or pair of tabs 98 and/or one or more pins or a pair of pins 99. The tabs 98 are formed from portions of the vertical wall of the inner slide segment 26 and allow the release body 96 to be snapped onto the tabs 98 and supported for sliding movement relative to the inner slide segment 26. The release body 96 includes an actuation member, such as an actuation cam surface 100 that engages a corresponding ramped surface 102 of the latch 84. Upon movement of the release body 96, the actuation surface 100 interacts with the ramped surface 102 to rotate the latch 84 against the biasing force of the spring 88 until the shoulder 90 is released from the tab 92, thereby permitting the inner slide segment 26 to be retracted. The illustrated release body 96 defines two actuation surfaces 100 such that the latch 84 can be release by moving the release body 96 in either a forward or rearward direction.

The second lock arrangement 82 preferably also includes a second latch 104 that is pivotally secured to the inner slide segment 26. A support shaft or pin 106 is secured to the inner slide segment 26 and rotatably supports the latch 104, which is biased to rotate about the pin 106 by a biasing member, such as a spring 108. The spring 108 biases an engagement portion 110 (e.g., a shoulder) of the latch 104 into engagement with the stop, stop surface or tab 92 in the intermediate slide segment 24 such that the inner slide segment 26 is secured, or locked, into an open position and prevented from being removed from the intermediate slide segment 24 (removed from the remainder of the slide assembly 20) until the latch 104 is released.

A release mechanism 114 operates to release the latch 104 from the tab 92 to permit the inner slide segment 26 to be retracted. The illustrated release mechanism 94 is manually actuated and positioned near the latch 104. That is, it does not extend all the way to the forward end of the inner slide segment 26 and is positioned rearward of a forward end of the release mechanism 94. However, other embodiments are possible in which the release mechanism is extends to the forward end of the inner slide segment 26 or is automatically actuated.

The illustrated release mechanism 114 includes a release body 116 slidably supported relative to the inner slide segment 26 by a support structure, such as one or more pins, tabs or a combination of pins 118 and a tab 119. The pair of pins 118 are secured to the vertical wall of the inner slide segment 26 and received within slots of the release body 116 to allow the release body 116 to be supported for sliding movement relative to the inner slide segment 26. Head portions of the pins 118 secure the release body 116 to the inner slide segment 26. The illustrated release body 116 extends from a location forward of the latch 84, over the latch 84 and to the latch 104. Preferably, the release body 116 extends to a location rearward of the latch 104. The release body 116 includes an actuation member, such as an actuation cam surface 120 that engages a corresponding ramped surface 122 of the latch 104. Upon movement of the release body 116 toward the latch 104 (preferably toward the forward end of the inner slide segment 26/slide assembly 20), the actuation surface 120 interacts with the ramped surface 122 to rotate the latch 104 against the biasing force of the spring 108 until the shoulder 110 is released from the tab 92, thereby permitting the inner slide segment 26 to be removed from the intermediate slide segment 24.

Preferably, two or more components of the lock arrangement 82 (e.g., two or more of the latches 84, 104, pins 86, 106 and springs 88, 108) are integrated with one another to form an integrated assembly. For example, preferably, the latch 84 forms an integrated assembly with the spring 88 and the latch 104 forms and integrated assembly with the spring 108. In the illustrated arrangement, the spring 88 or 108 is relatively linear in shape and has one end secured within the latch 84 or 104. The other end of the spring 88 or 108 is held by a spring retainer, such as a tab 130, which can be created from the material of the vertical wall of the inner slide segment 26. Other suitable arrangements (e.g., pins) could also be used.

Preferably, the latch and spring assemblies (84 and 88, 104 and 108) are created by co-molding or overmolding one component with the other component. In particular, the latch 84 or 104 can be molded onto the spring 88 or 108 during the forming of the latch 84 or 104. In such a process, a portion of the spring 88 or 108 can be inserted into a mold cavity used to form the latch 84 or 104 before the material used to create the latch 84 or 104 is introduced to the mold cavity. Thus, once the material hardens, the portion of the spring 88 or 108 is secured within the body of the latch 84 or 104 to form an integrated assembly. The latch material may be plastic (injection molded) or metal (die cast), or any other suitable material created by a suitable process. Advantageously, such an arrangement creates a space-efficient product and eases the assembly process by eliminating an assembly step. Furthermore, the use of small springs in a manufacturing environment presents difficulties in that the stock of springs used for assembly purposes can get tangled together, thereby slowing the assembly process. The present integrated assembly reduces this common problem.

The slide assembly 20 could also employ other locks to accomplish other functions. For example, a third lock arrangement could be operable to selectively secure the inner slide segment 26 in an intermediate position, between an open position and a closed position, relative to the intermediate slide segment 24. The slide assembly 20 could also include a fourth lock arrangement or a "lock closed" arrangement. The fourth lock could be configured to selectively secure the slide assembly 20 in a closed position, in which the intermediate slide segment 24 is retracted relative to the outer slide segment 22, and the inner slide segment 26 is retracted relative to the intermediate slide segment 24. Preferably, the third and fourth locks are of any suitable construction, such as similar to, substantially the same as or identical to the other locks described herein from a structural and functional standpoint. Accordingly, a detailed discussion of the structure and operation of the third lock and fourth locks is omitted.

Although multiple lock arrangements are discussed herein and referred to as first, second, third and fourth locks, it is not required nor implied that all four lock arrangements are necessarily present in any particular embodiment. Rather, some or all of the lock arrangements may be used depending on the particular application and the desired operational sequence of the slide assembly. Moreover, additional lock arrangements may also be provided.

Preferably, the inner slide segment 26 is configured to support an object. As described above, in one arrangement, the slide segment 26 is configured to support a computer server. In a preferred embodiment, the inner segment 26 includes a plurality of slots 150, which receive mounting pins or rivets provided on the computer server (not shown). Preferably, the mounting pins include a head portion and a smaller shaft portion. The upper end of each of the slots 150 defines an opening 152 configured to allow both a head portion and a shaft portion of the mounting pin to pass into the slot 150. Preferably, the slot 150 then receives the shaft portion of the mounting pin. The inner segment 26 preferably includes more than one slot 150 and may include two, three, four or more slots 150 configured to receive mounting pins. Preferably, the slots 150 are generally or substantially L-shaped or J-shaped so that the mounting pin enters the slot 150 at an upper end (through the opening 152) and drops downward into a secure position.

Preferably, the inner slide segment 26 includes a locking mechanism 160 corresponding to one or more of the slots 150. Preferably, the locking mechanism 160 includes a locking element, such as a lock arm or spring arm 162, which can selectively secure a mounting pin within the associated slot 150. The illustrated spring arm 162 is an elongated flexible member that extends along an outboard side surface of the inner slide segment 26. One end (e.g., a rearward end) of the spring arm 162 is secured to the inner slide segment 26 by a suitable fastening arrangement, such as one or more fasteners. The other end of the spring arm 162 is free to move in a lateral direction relative to the inner slide segment 26 and includes features that permit entry of a mounting pin into the closed end of the slot 150 and inhibit undesired removal of the mounting pin. The spring arm 162 is normally biased to a closed position (e.g., adjacent the inner slide segment 26) and can be selectively moved to an open position (e.g., away from the inner slide segment 26) to permit removal of the mounting pin. A flex zone 166 can be provided to facilitate flexing of the spring arm 162 and reduce stress and fatigue. The illustrated flex zone 166 includes a semi-cylindrical bend between the secured end and the free end of the spring arm 162.

The free end of the spring arm 162 can include an opening 170 that is sized to permit a head of the mounting pin to pass therethrough in a lateral direction. Preferably, the opening 170 is completely enclosed. In other words, the opening 170 is completely surrounded by material of the spring arm 162. A portion of the spring arm 162 surface defining the opening 170 also defines a stop surface 172 that, when the mounting pin is present within the closed end of the slot 150, blocks the slot 150 to inhibit removal of the mounting pin from the slot 150. An upwardly-facing angled tab 174 extends in an outboard direction from the remainder of the spring arm 162. The angled tab 174 is configured to be contacted by the head of the mounting pin upon entry of the mounting pin into the slot 150. Movement of the mounting pin toward the closed end of the slot 150 biases the spring arm 162 toward the open position and allows the mounting pin to pass into the closed end of the slot 150. Once the head of the mounting pin is aligned with the opening 170, the spring arm 162 can move back to the closed position, with the head of the mounting pin passing through the opening 170. The stop surface 172 then inhibits removal of the mounting pin from the slot 150. Such an arrangement is often referred to as a "drop and lock" arrangement because the server (or other object) with mounting pins can be "dropped" into engagement with the slots 150 of the inner slide segment(s) 26 and automatically locked in place. As discussed above, the inner slide segment 26 can also be removed from the remainder of the slide assembly 20. Thus, the server (or other object) can be removed from the server rack (or other support or enclosure) while the inner slide segments 26 remain connected to the server (or other object) by removing the inner slide segment(s) 26 from the remainder of the slide assembly 20, as described above. The server (or other object) can be reassembled to the server rack (or other support or enclosure) by reinserting the inner slide segment(s) 26 into the intermediate slide segment 24 (referred to as "stab-in"). Thus, the illustrated slide assembly 20 provides both "drop and lock" and "stab-in" capabilities.

Preferably, the inner segment 26 also includes a release member 176 configured to selectively release the mounting pin from the slot 150 by moving the spring arm 162 to the open position. Preferably, the release member 176 includes a ramped contact surface 178 that engages a forwardly-extending angled release tab 180 of the spring arm 162. The release tab 180 extends in an outboard direction from the remainder of the spring arm 162. Rearward movement of the release member 176 moves the spring arm 162 toward the open position to allow the mounting pin to be removed from the slot 150. The spring tension of the spring arm 162 can hold the release member 176 via frictional force in a rearward position thus maintaining the spring arm 162 in the open position. Preferably, the frictional force generated by the spring arm 162 is the only force utilized to hold the release member 176 in the rearward position and no additional holding or biasing members are provided. Accordingly, the server (or other object) can be removed from engagement with the inner slide segment 26 without requiring the release member 176 to be manually held in a rearward (releasing) position. Preferably, as the mounting pin is removed from the slot 150, it contacts the ramped surface 178 and moves the release member 176 back to a forward position, which allows the spring arm 162 to move back to the closed position. Thus, the locking mechanism 160 is reset and ready to receive a mounting pin within the slot 150. This can be referred to as a "self-resetting hands-free" disconnect arrangement.

The release member 176 can be of any suitable arrangement. In the illustrated arrangement, the release member 176 is slidably supported relative to the inner slide segment 26. In particular, the release member 176 is supported by one or more fasteners, such as pins or rivets 182. The release member 176 can include a plurality of ridges or other roughened surface features to enhance friction during manual movement of the release member 176. Accordingly, it is not necessary to provide laterally extending finger grip features and a narrow profile of the release member 176 can be maintained. As illustrated, the inner segment 26 may include a single locking mechanism 160 and release member 176 adjacent to one slot 150, such as the forward-most slot, for example. A single locking mechanism 160 and release member 176 may be configured adjacent to any one of the slots 150 on the inner segment 26. Alternatively, the inner segment 26 may include more than one locking mechanism 160 and release member 176 at various slots 150.

Figure 16:
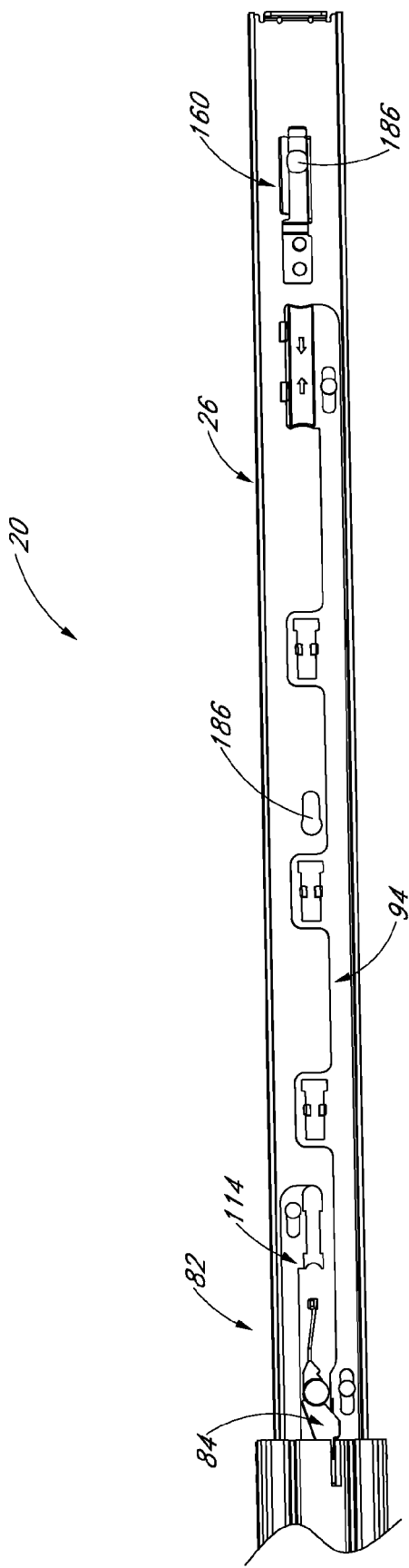
FIG. 16 is a side view of a second slide assembly, illustrating an outside of the inner slide segment.

FIG. 16 illustrates an alternative inner slide segment 26, which when incorporated in a slide assembly 20, provides only "stab-in" capabilities and does not permit "drop and lock" assembly of the server (or other object) to the slide assembly 20/inner slide segment 26. Thus, the inner slide segment 20 can be removed and reinserted relative to the remainder of the slide assembly 20 as described above. The illustrated inner slide segment 26 includes a plurality of slots or keyholes 186, which receive the rivets or pins provided on the computer server (not shown). As described, the pins include a head portion and a smaller shaft portion. The large opening of the keyhole 186 is configured to allow the head portion of the pin to pass and the slot of the keyhole 186 receives the shaft portion of the pin. Preferably, multiple (e.g., two, three, four, five or more) keyholes 186 are provided. Desirably, at least as many keyholes 186 are provided as pins present on the object with which the slide assembly 20 is intended for use.

A locking device, such as the locking mechanism 160 described above, may be associated with one or more of the keyholes 186 to secure the pin within the slot of the keyhole 186 once the pin is inserted. The slide assembly 20 could include a release mechanism (such as release member 176 described above) or an angled tab (such as the release tab 180) can provide a finger grip portion to allow the spring arm 162 to be flexed in an outboard direction to permit the pin to be removed from the keyhole 186 (and, thus, the server or other object to be separated from the inner slide segment 26/slide assembly 20).

Figure 17:
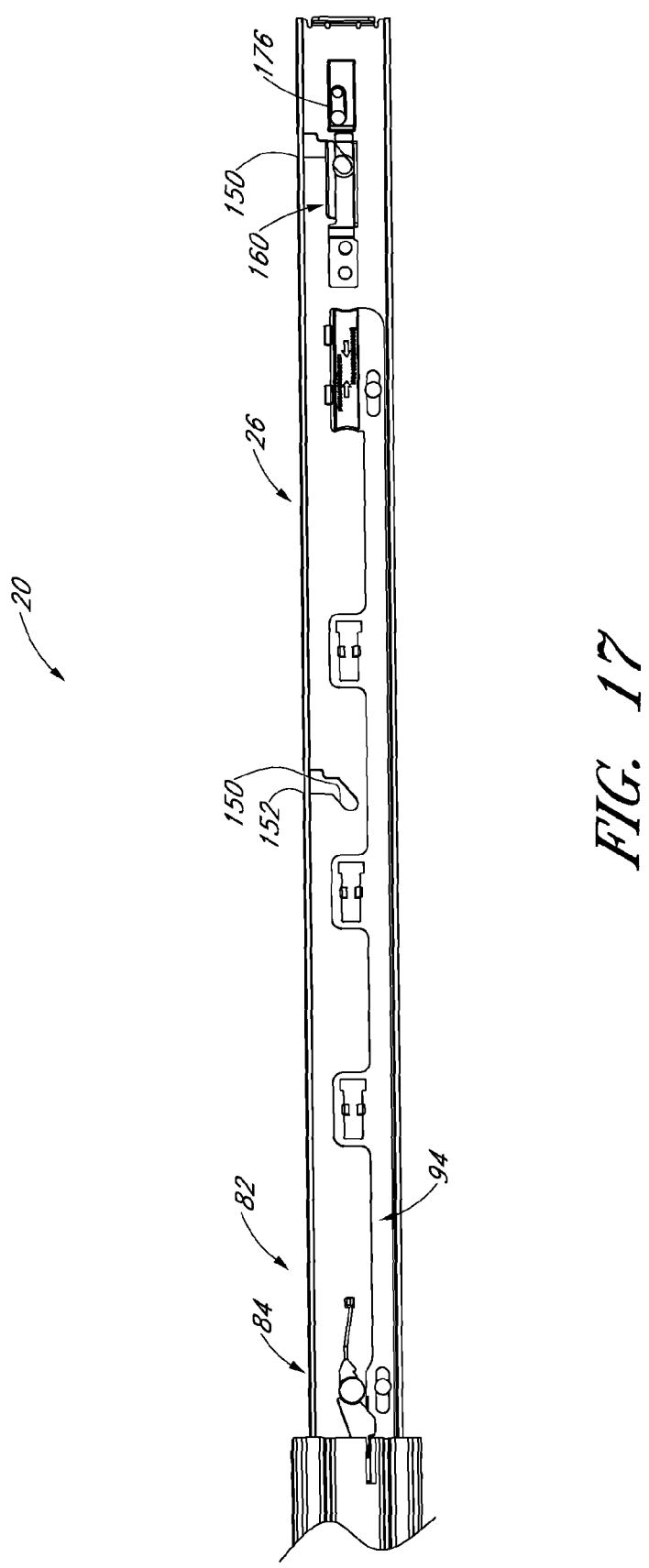
FIG. 17 is a side view of a third slide assembly, illustrating an outside of the inner slide segment.

FIG. 17 illustrates an alternative inner slide segment 26 which, when incorporated in a slide assembly 20, provides only "drop in" or "drop and lock" capabilities and not "stab-in" capabilities. Thus, in this arrangement, removal of the inner slide segment 26 is not permitted and the second latch 104 and release mechanism 114 are omitted.

The components of the slide assembly 20 may be constructed of any suitable material and by any suitable manufacturing process. However, in a preferred embodiment, one or more and preferably each of the segments 22, 24, 26 of the slide assembly 20 are constructed of a steel material that is roll formed and then, if necessary or desired, the bearing surfaces are machined to the desired tolerances.

In operation, the slide assembly 20 is coupled to the server rack. One of the brackets 34, 36 is coupled to the respective one of the forward or rearward vertical rails of the server rack. The adjustable bracket(s) 34, 36 can be slid relative to the segments 22, 24, 26 to adjust the length of the mounting arrangement 28 such that the other of the brackets 34, 36 can be coupled to the other of the forward and rearward rails of the server rack. The latches 42 engage the rails of the server rack to inhibit unintentional disconnection of the slide assembly 20. Typically, another slide assembly 20 is secured to the other side of the server rack. A computer server can be connected to the slide assembly 20 by engaging the pins of the server with the slots 150 or keyholes 186 of the inner slide segment 26.

From a closed position, the slide assembly 20 can be extended. As the slide assembly 20 is extended, the lock 70 releases once the intermediate slide segment 24 has reached an open position relative to the outer slide segment 22 to allow the inner slide segment 26 to open relative to the intermediate slide segment 24. Once the inner slide segment 26 reaches an open position, the lock 82 engages to secure the inner slide segment 26 in the open position. To retract the slide assembly 20, the latch 84 is released and the inner slide segment 26 is retracted. The inner slide segment 26 contacts the latch 72 to disengage the lock 70, which permits the intermediate slide segment 24 to retract relative to the outer slide segment 22. Alternatively, when the inner slide segment 26 is open, it can be removed from the remainder of the slide assembly 20 by actuating the latch 104.

Figure 18:
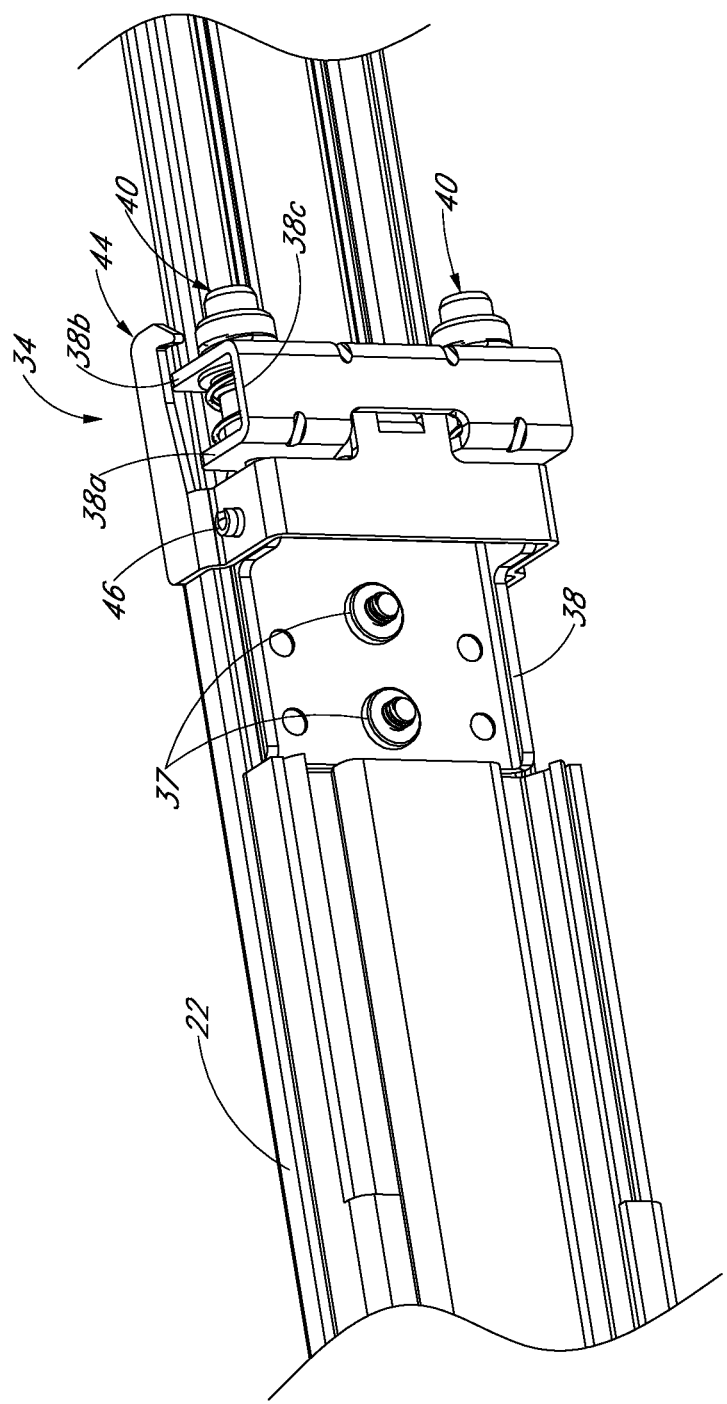
FIG. 18 is a perspective view of a top and outside of an alternative to the mounting bracket of FIGS. 3 and 4.

FIG. 18 illustrates an alternative mounting bracket 34 that can be used in place of the first or second mounting brackets 34, 36 disclosed herein. A height of the latch 44 between the locations supported by the pivot pin 46 is greater than a corresponding height of the latch 44 illustrated in FIGS. 3 and 4. Preferably, the height of the latch 44 at the supported locations is substantially equal to a height of the bracket body 38 and/or the outer slide segment 22 and can be located above and below (or straddle) the pin assemblies 40. With such an arrangement, the illustrated arrangement of FIG. 18 provides added strength relative to the bracket 38 illustrated in FIGS. 3 and 4. In addition, the first flange portion 38a and the second flange portion 38b are connected to one another by a third flange portion 38c, which preferably extends substantially an entire height of the bracket body 38 and/or the outer slide segment 22. The second flange portion 38b also extends substantially an entire height of the bracket body 38, while the first flange portion 38a includes a central cut-out to accommodate the biasing member or spring 48 (not shown in FIG. 18). In other respects, the bracket 34 can be the same as or similar to the other brackets 34, 36 disclosed herein, or can be of any other suitable arrangement.

Figure 19:
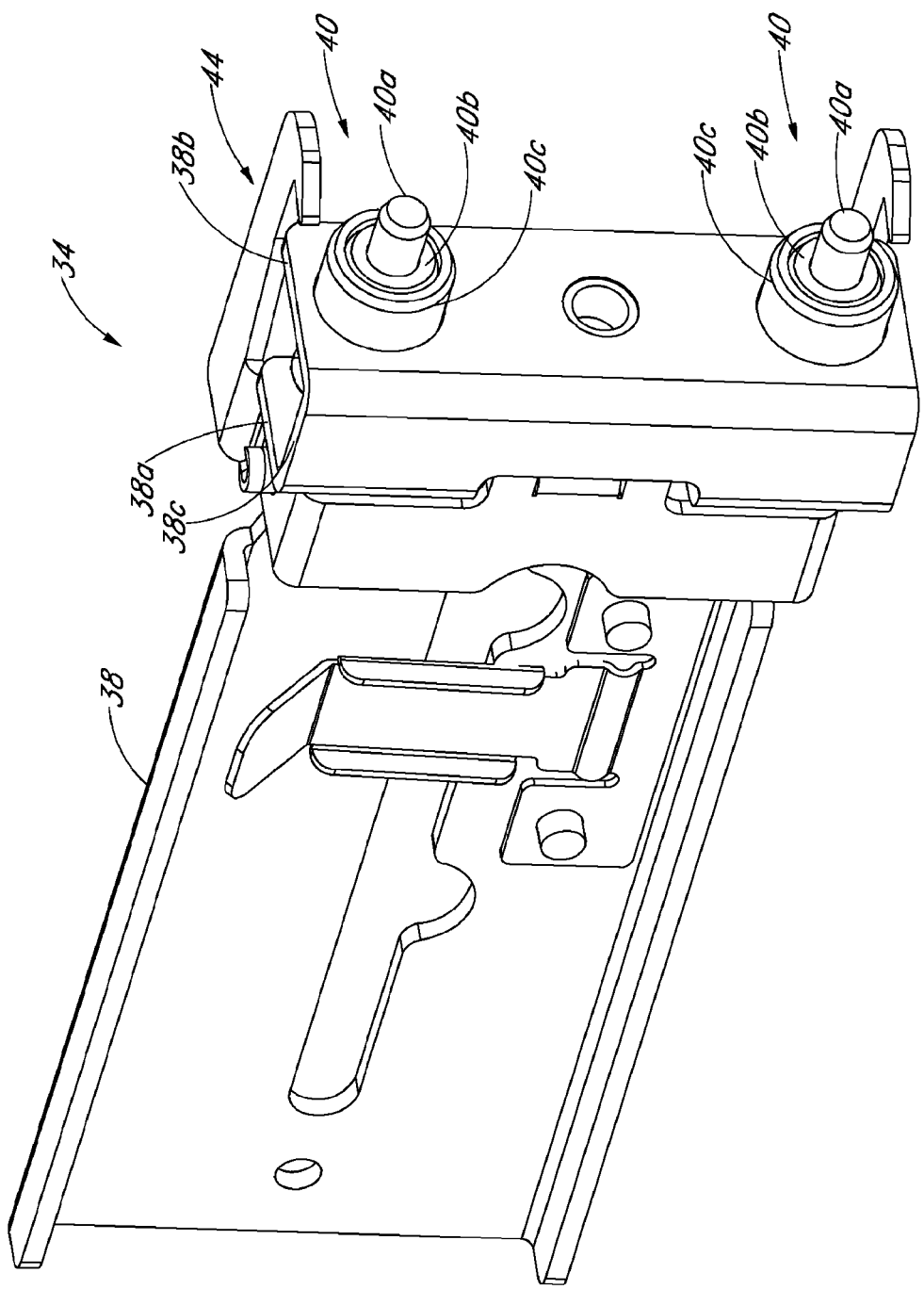
FIG. 19 is a perspective view of a front and outside of an alternative to the mounting bracket of FIG. 18.

FIG. 19 illustrates a bracket 34 that is similar to the bracket 34 of FIG. 18; however, the bracket 34 of FIG. 19 includes alternative pin assemblies 40. In particular, while the pin assemblies 40 of FIG. 18 are 2-pin versions including two pin members (first pin 40a and second pin 40b), the pin assemblies 40 of FIG. 19 are 3-pin versions including three pin members (first pin 40a, second pin 40b and third pin 40c). In the illustrated arrangement, the second pin 40b and the third pin 40c are coaxially mounted on the first or inner pin 40a. The inner or first pin 40a is supported by the first flange portion 38a and extends through an aligned opening in the second flange portion 38b. The second pin 40b and the third pin 40c are positioned outside of the space defined between the first flange portion 38a and the second flange portion 38b and are movable relative to the first pin 40a and one another along an axis of the first pin 40a toward (and, preferably, into) the space between the first flange portion 38a and the second flange portion 38b. Preferably, each of the second pin 40b and the third pin 40c are biased away from the space between the first flange portion 38a and the second flange portion 38b by one or more biasing members (not shown). Preferably, each of the second pin 40b and the third pin 40c has a corresponding biasing member. One or both of the second pin 40b and the third pin 40c can be moved out of the way by the area of a server rack mounting rail surrounding a mounting hole, leaving an appropriate one of the first, second or third pins 40a, 40b, 40c to engage the mounting hole of the server rack mounting rail. With such an arrangement, the brackets 34, 36 can automatically adjust for a specific hole size or shape of the server rack mounting rail and, preferably, for at least three different hole sizes and/or types.

Figure 20:
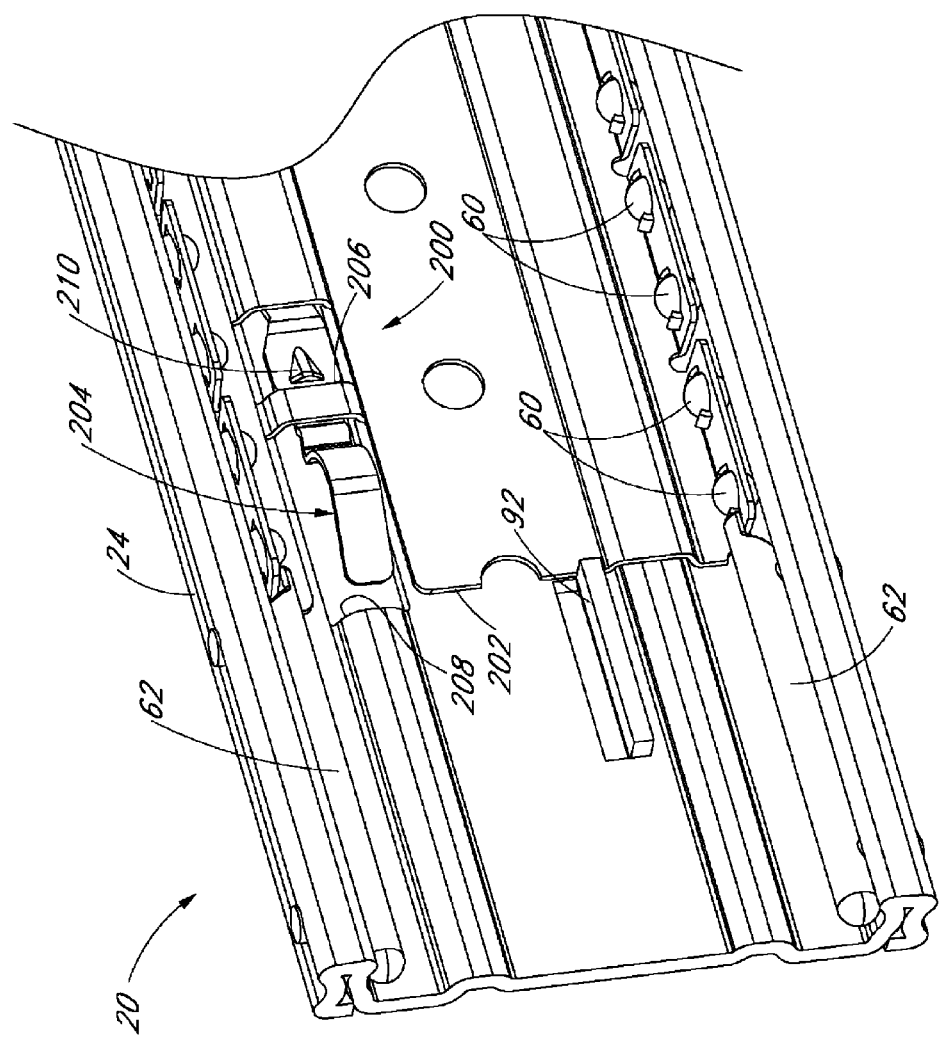
FIG. 20 is a perspective view of a top and inside of a slide assembly with the inner slide segment removed having an alternative to the bearing assembly of FIG. 7, which includes a ball bearing retainer hold forward arrangement.
Figure 21:
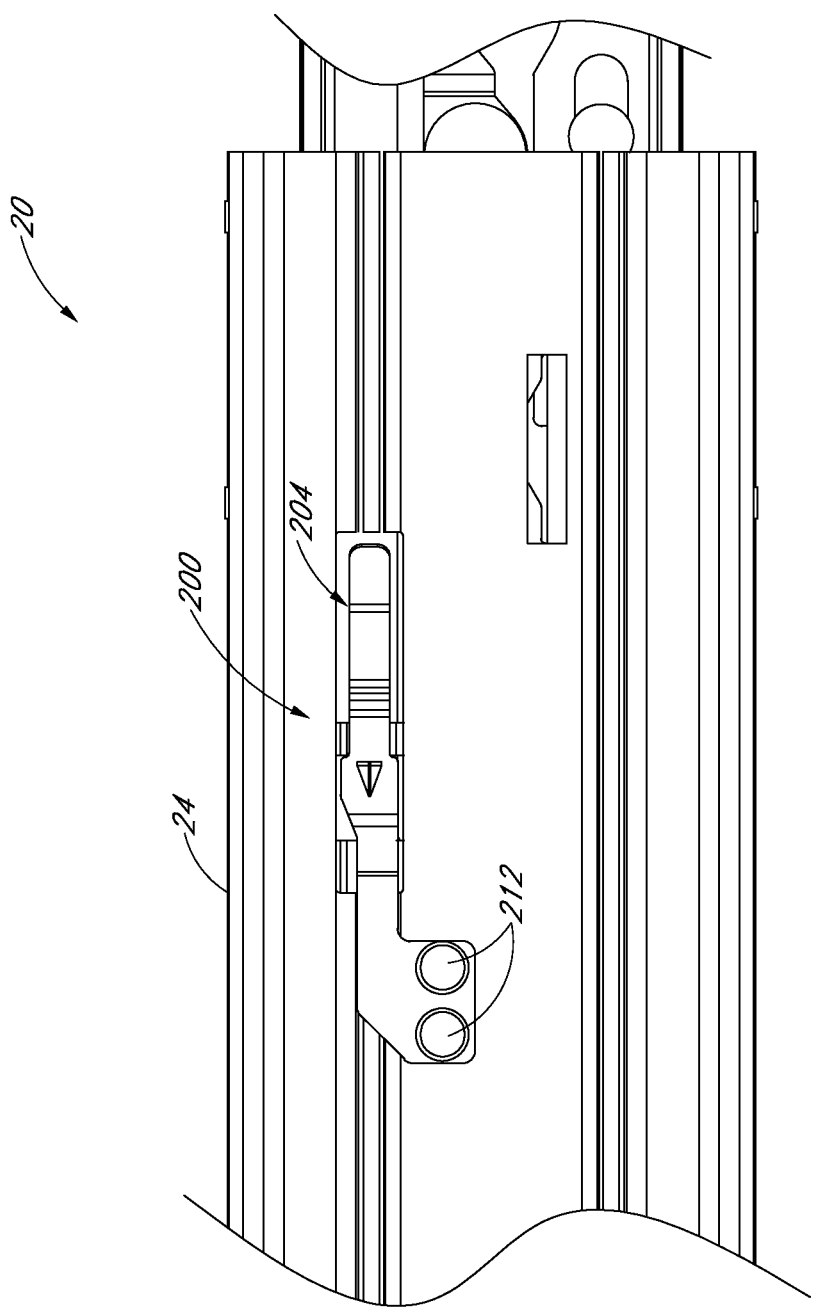
FIG. 21 is a side view of an outside of the slide assembly of FIG. 20.

FIGS. 20 and 21 illustrate a slide assembly 20 having a ball retainer hold forward arrangement, generally indicated by the reference number 200. In FIG. 20, the inner slide segment 26 is removed to reveal underlying structure. As described above, the inner slide segment 26 is supported for movement relative to the intermediate slide segment 24 by a bearing assembly and, in particular, a plurality of ball bearings 60. The ball bearings 60 are carried by and separated from one another by a ball retainer 202. The ball retainer hold forward arrangement 200 retains the ball retainer 202 in a forward position within the intermediate slide segment 24 when the inner slide segment 26 is removed from and upon initial reinsertion into the intermediate slide segment 24. Preferably, the ball retainer hold forward arrangement 200 releases the ball retainer 202 after the inner slide segment 26 is reinserted into the intermediate slide segment 24.

In particular, the ball retainer hold forward arrangement 200 comprises a lock arm 204 that engages an engagement surface of the ball retainer 202, which can be defined by a window 206, notch or slot of the ball retainer 202. The illustrated lock arm 204 is an elongate member formed from or including a resilient material. In one embodiment, the lock arm 204 is constructed from 301 stainless steel. However, other suitable materials (e.g., metal, plastics or combinations thereof) can also be used. The lock arm 204 is secured to the intermediate slide segment 24 and, preferably, to an outer surface of the segment 24. An actuation portion 204a of the lock arm 204 extends through an opening 208 in the intermediate slide segment 24. The actuation portion 204a comprises a curved portion that is engaged by the inner slide segment 26 as it is re-inserted into the intermediate slide segment 24. The inner slide segment 26 biases the lock arm 204 away from the ball retainer 202 such that an engagement portion 210 formed from or carried by the lock arm 204 is moved out of registration with the engagement surface of the window 206, thereby allowing the ball retainer 202 to move rearwardly along with the inner slide segment 26. Preferably, the inner slide segment 26 engages at least one set of ball bearings 60 (e.g., at least one upper and lower bearings 60) before the ball retainer 202 is released. Any portion of the inner slide segment 26, or any member carried thereby, can be configured to actuate the lock arm 204. In some embodiments, the inner slide segment 26 can comprise an actuation member (e.g., a tab) carried by or formed from the inner slide segment 26 that is configured to contact the actuation portion 204a of the lock arm 204.

The lock arm 204 can be coupled to the intermediate slide segment 24 by any suitable arrangement, such as one or more fasteners (e.g., rivets 212). Preferably, the lock arm 204 extends in a lengthwise direction of the intermediate slide segment 24 and is positioned between a centerline of the segment 24 and one of the upper or lower edges of the segment 24. Thus, the ball retainer hold forward arrangement 200 occupies less space within the slide assembly 20, especially in a vertical direction, than prior arrangements. Advantageously, more space is provided for other features of the slide assembly 20. A forward-most position of the ball retainer 202 can be defined by any suitable structure or arrangement, such as the lock arm 204, a dedicated stop or slide lead-in guide 62 or another structure (e.g., tab 92).

Figure 22:
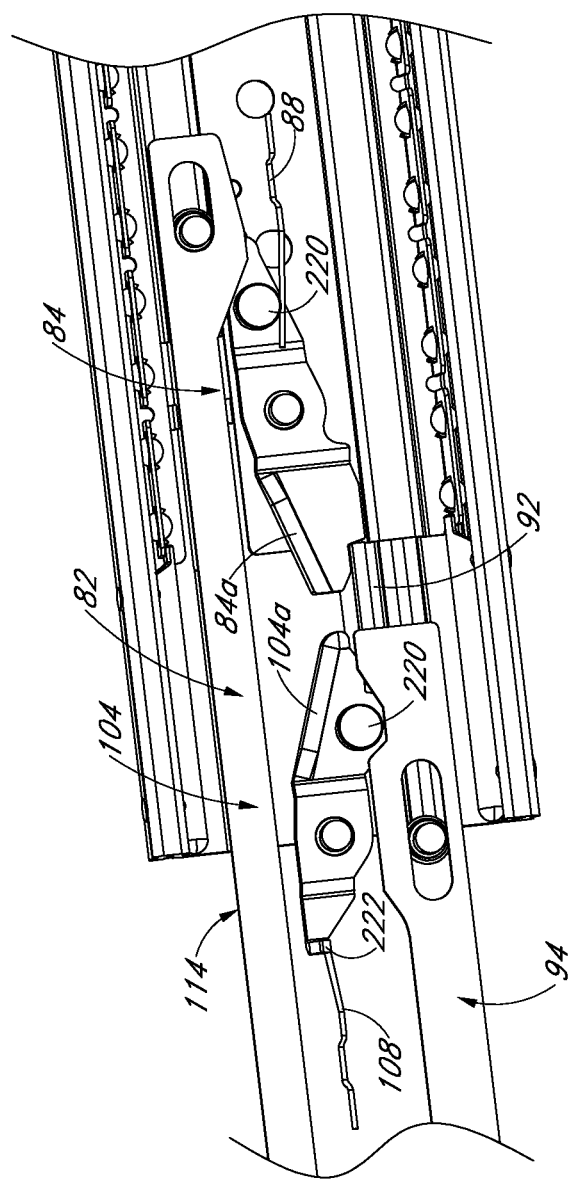
FIG. 22 is perspective view of a top and inside of the slide assembly of FIG. 20 with the inner slide segment removed to show a lock arrangement.

FIG. 22 illustrates an alternative of the lock arrangement 82 of FIGS. 10-13, which secures the inner slide segment 26 in an open position relative to the intermediate slide segment 24. In FIG. 22, the inner slide segment 26 is removed to reveal underlying structure. The lock arrangement 82 of FIG. 22 is substantially similar to the lock arrangement 82 of FIGS. 10-13 and, therefore, this disclosure is directed toward the differences between the two. Features or structures not described can be assumed to be the same as or similar to the lock arrangement 82 of FIGS. 10-13, or of any other suitable construction.

Preferably, the latches 84 and 104 are constructed from metal material instead of plastic. In some configurations, the latches 84 and 104 can be constructed from sheet metal material and bent into the desired form, such as by a stamping process, for example. The latches 84 and 104 include upper thickened portions or flanges 84a and 104a that increase the rigidity or stiffness of the latches 84 and 104. In addition, the springs 88 and 108 preferably are not molded or otherwise integrated with the latches 84 and 104, but are separate components. In the illustrated arrangement, the latches 84 and 104 include actuation members 220 in the place of the ramped surfaces 102 and 122 of the latches 84 and 104 of FIGS. 10-13. Each of the actuation members 220 can be a protrusion or protruding member, such as a cylindrical boss, that is coupled to or formed by the latches 84 and 104. The actuation members 220 interact with the release mechanisms 94 and 114 to release the tab 92 from the space between the latches 84 and 104 to permit closure or removal of the inner slide segment 26. The spring 88 engages the actuation member 220 of the latch 84 to apply a biasing force to the latch 84. The spring 108 engages a hook 222 of the latch 104 to apply a biasing force to the latch 104.

Figure 23:
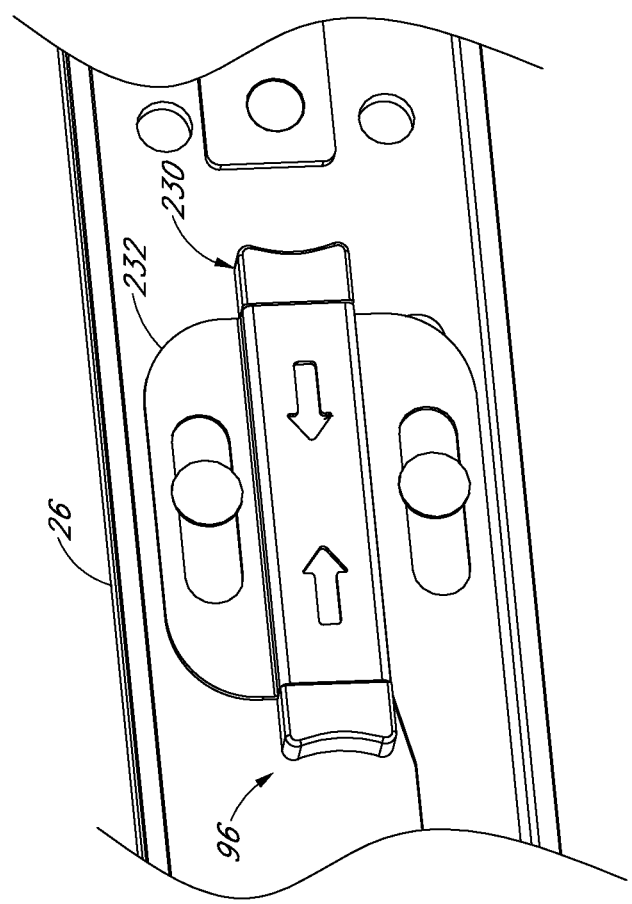
FIG. 23 is a side view of a finger latch and lever arm of a release mechanism, which is an alternative of the release mechanism of FIG. 10.
Figure 24:
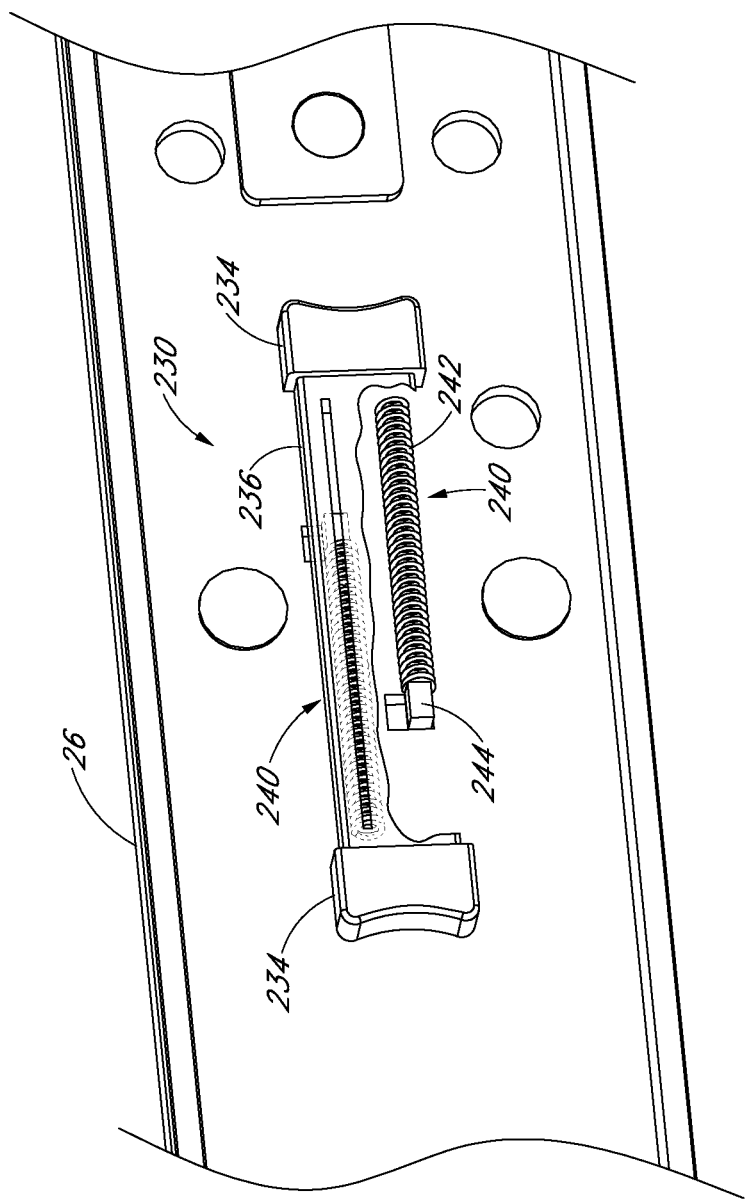
FIG. 24 is a side view of the finger latch of FIG. 23 with the lever arm removed for clarity and a portion of the finger latch cut away to show a return spring.

FIGS. 23 and 24 illustrate an alternative release body 96 of the release mechanism 94. Preferably, although not separately described, the release body 116 of the release mechanism 114 can be the same or similar. In particular, the release body 96 includes a finger latch 230 that is a separate member from the lever arm 232 that makes up a majority of the release body 96 and is trapped between the lever arm 232 and the inner slide segment 26. FIG. 24 illustrates the release body 96 with the lever arm 232 removed to illustrate the underlying finger latch 230. Preferably, the finger latch 230 includes at least one, and preferably a pair, of finger grip portions 234 configured to provide a surface to be actuated by a finger of a user of the slide assembly 20. A central portion 236 of the finger latch 230 extends between the finger grip portions 234 and is recessed relative thereto such that the finger grip portions 234 engage the lever arm 232 to move the lever arm 232 with the finger latch 230. The release body 96 can be biased toward a neutral position by a biasing arrangement 240, which comprises at least one biasing element 242 (e.g., a spring) extending between a tab 244 of the inner slide segment 26 and the finger latch 230. In the illustrated arrangement, the biasing arrangement 240 includes a pair of biasing elements 242 that apply forces in opposite directions to the release body 96.

Figure 25:
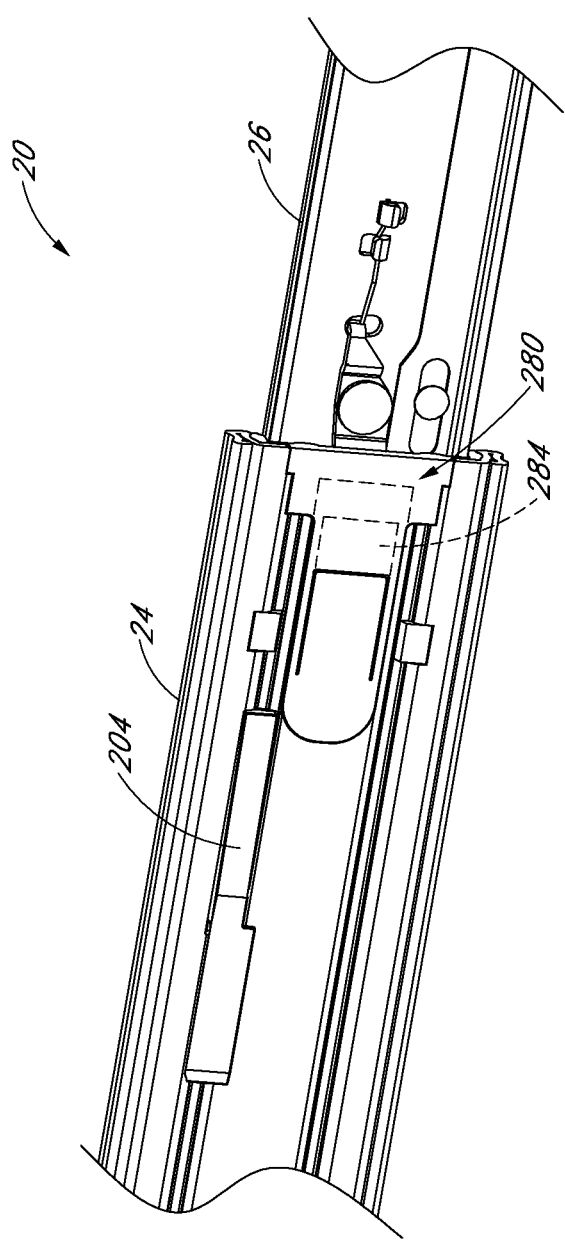
FIG. 25 is a side view of an outside of a slide assembly, which includes an alternative of the ball bearing retainer hold forward arrangement of FIG. 20 and an alternative of the lock arrangement of FIG. 22.
Figure 26:
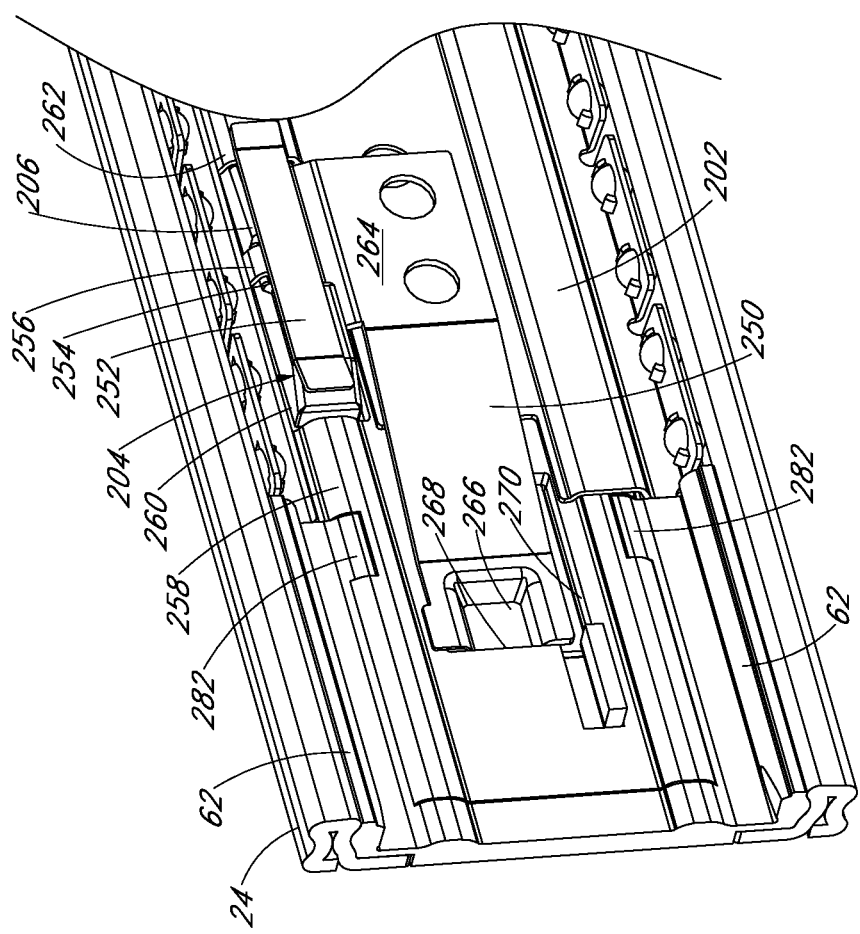
FIG. 26 is a perspective view of a top and inside of the slide assembly of FIG. 25 with the inner slide segment removed to illustrate the lock arrangement.

FIGS. 25-26 illustrate alternative arrangements of the ball retainer lock arm 204 and an alternative to the latch 104. In FIG. 26, the inner slide segment 26 is removed to illustrate underlying structure. The ball retainer lock arm 204 is an elongate arm constructed from a plastic material, although other suitable materials can be used. The inner slide segment 26 carries a lock arm 250 that is an alternative to the latch 104. In the illustrated arrangement, the lock arm 250 incorporates an actuation member 252 that contacts and disengages the ball retainer lock arm 204. The ball retainer lock arm 204 includes a recess 254 that engages an engagement surface 206 of an engagement section 256 of the ball retainer 202. A forward end of the ball retainer 202 defines a section 258 that is aligned in a vertical direction with the engagement section 256 and that has a greater longitudinal length than the engagement section 256 and the recess 254 such that the section 258 can pass over the ball retainer lock arm 204 without engaging the recess 254. A pair of windows 260, 262 are defined on either side of the engagement section 256 and are configured to accommodate the ball retainer lock arm 204. In operation, the actuation member 252 contacts and moves the ball retainer lock arm 204 to release the ball retainer 202. However, in alternative arrangements, the ball retainer lock arm 204 can be actuated by a member or structure formed from the inner slide segment 26 or that is separate from the lock arm 250.

In the illustrated arrangement, the lock arm 250 is a resilient member that is carried by the inner slide segment 26, moves in a lateral direction of the slide assembly 20 and is biased in an outward direction or toward the intermediate slide segment 24. The lock arm 250 can be constructed of any suitable material, such as 301 stainless steel. However, other suitable materials (e.g., metal, plastics or combinations thereof) can also be used. The lock arm 250 includes a mounting portion 264 that permits the lock arm 250 to be coupled to the inner slide segment 26, such as by one or more suitable fasteners, such as rivets (not shown). The lock arm 250 also includes an engagement portion, which includes a protrusion 266 that engages an engagement surface 268 defined by a window 270 of the intermediate slide segment 24. The protrusion 266 contacts the engagement surface 268 when the inner slide segment 26 is in the open position such that the inner slide segment 26 cannot be removed from the intermediate slide segment 24 until the lock arm 250 is actuated.

Figure 27:
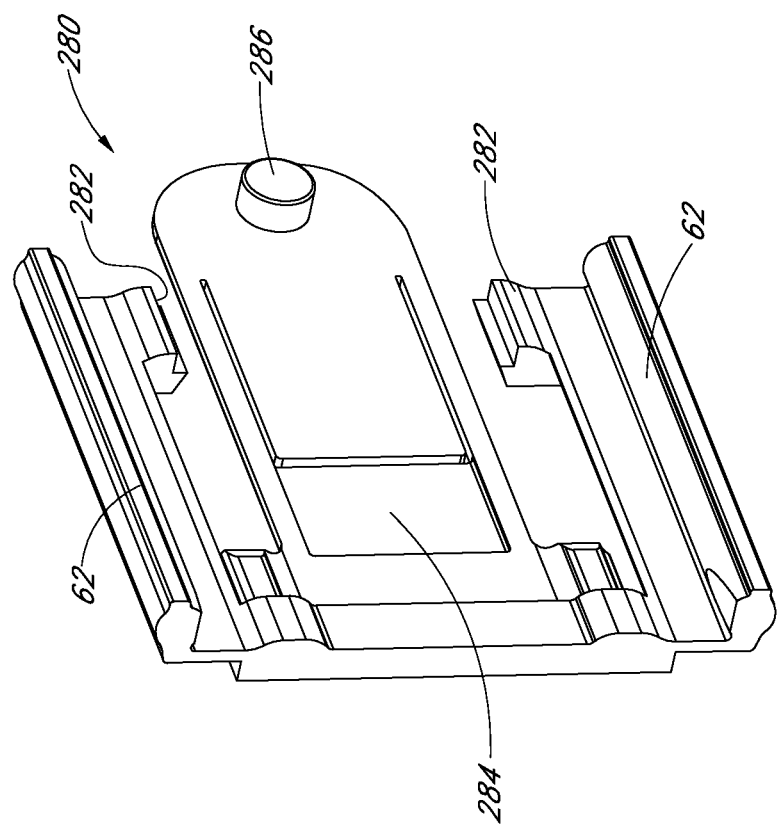
FIG. 27 is a perspective view of a top and inside of the actuator of the lock arrangement of FIG. 25.

With additional reference to FIG. 27, an actuator 280 can be employed to move the lock arm 250 from an engaged position to a disengaged position to allow the inner slide segment 26 to be removed from the intermediate slide segment 24. In the illustrated arrangement, the actuator 280 is a combination lead-in guide 62 for the inner slide assembly 26 and actuator for the lock arm 250. The actuator 280 is positioned on each side of the intermediate slide segment 24 and includes tabs 282 that engage corresponding recesses in the intermediate slide segment 24 to secure the actuator 280 in place. The actuator 280 includes a touch point portion 284 positioned on the outside of the intermediate slide segment 24 and operable to extend through the window 270 and move the lock arm 250 out of engagement with the engagement surface 268. Such an arrangement provides a "non-pinch" method of operating the lock arm 250. Preferably, the touch point portion 284 is a resilient arm that is unitary with the actuator 280. The actuator 280 can also include a protrusion 286 at or near the base end of the touch point portion 284 that can engage a corresponding opening (not shown) in the intermediate slide segment 24 to assist in securing the actuator 280 to the intermediate slide segment 24. In some arrangements, a manufacturing process called "heat staking" can be utilized. Generally, in such a process, a small, instant amount of heat is applied to the protrusion 286, which melts/forms the protrusion 286 over the opening or hole in the intermediate slide segment 24. Once the heat is removed, the material quickly cools and the actuator 280 is secured in place. In some embodiments, portions of the ball retainer hold forward (e.g., the lock arms 204) can be attached utilizing the same or similar process of "heat staking". These components can be attached by other suitable arrangements or methods, as well. The actuator 280 can be constructed of any suitable material by any suitable process, such as a plastic material constructed by an injection molding process, for example.

The slide assemblies 20 can be constructed in various sizes including sizes corresponding to 1 U, 2 U, 3 U, 4 U, 5 U, 6 U and larger server arrangements. Each of the embodiments described herein can be constructed and sized to a desired server size/arrangement and each embodiment may also be constructed and sized to other applications outside of computers and servers.

Although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. In particular, while the present slide assemblies have been described in the context of particularly preferred embodiments, the skilled artisan will appreciate, in view of the present disclosure, that certain advantages, features and aspects of the assemblies may be realized in a variety of other applications, many of which have been noted above. Additionally, it is contemplated that various aspects and features of the invention described can be practiced separately, combined together, or substituted for one another, and that a variety of combination and subcombinations of the features and aspects can be made and still fall within the scope of the invention. Thus, it is intended that the scope of the present invention herein disclosed should not be limited by the particular disclosed embodiments described above, but should be determined only by a fair reading of the claims.

What is claimed is:

1. A slide assembly, comprising:
an outer slide segment constructed from a bent piece of material having a single wall thickness, the outer slide segment having a wall portion, an upper portion and a lower portion, wherein the upper and lower portions are separated from one another by the wall portion and each of the upper and lower portions define a bearing surface, wherein each of the upper and lower portions comprise two layers of the piece of material such that an effective wall thickness of the upper and lower portions is greater than a wall thickness of the wall portion extending between the upper and lower portions;
at least one intermediate slide segment telescopically engaged with the outer slide segment, the at least one intermediate slide segment having a centerline, a first bearing surface and a second bearing surface, the at least one intermediate slide segment further comprising a first elongate protrusion between the centerline and the first bearing surface and a second elongate protrusion between the centerline and the second bearing surface;
an inner slide segment telescopically engaged with the at least one intermediate slide segment, the inner slide segment having a first bearing surface and a second bearing surface;
wherein the first and second bearing surfaces of each slide segment carry a load applied by the other slide segments;
a bearing assembly interposed between the inner slide segment and the intermediate slide segment, wherein the bearing assembly comprises a ball retainer and the intermediate slide segment comprises a ball retainer hold forward lock arm that engages the ball retainer and is released by the inner slide segment, wherein an entirety of the ball retainer hold forward lock arm is located between a centerline and one of the upper and lower edges of the intermediate slide segment, and wherein the ball retainer hold forward lock arm is aligned with one of the first elongate protrusion and the second elongate protrusion;
wherein the ball retainer hold forward lock arm comprises an engagement portion that engages a slot in the ball retainer and an actuation portion that moves laterally in a direction transverse to a longitudinal axis of the slide assembly, the actuation portion configured to be actuated by the inner slide segment to move the ball engagement portion laterally away from the ball retainer.

2. The slide assembly of claim 1, wherein each of the upper portion and the lower portion comprises a returned edge that extends from an outward one of the two layers toward the wall portion.

3. The slide assembly of claim 1, wherein the at least one intermediate slide segment is constructed from a bent piece of material having a single wall thickness, wherein the at least one intermediate slide segment has a wall portion, an upper portion and a lower portion, wherein the upper and lower portions are separated from one another by the wall portion, wherein each of the upper and lower portions comprise two layers of the piece of material such that an effective wall thickness of the upper and lower portions is greater than a wall thickness of the wall portion extending between the upper and lower portions.

4. The slide assembly of claim 3, wherein the outer slide segment and the at least one intermediate slide segment are each shaped by a roll forming process.

5. The slide assembly of claim 1, further comprising a mounting arrangement comprising a first bracket and a second bracket, wherein each of the first bracket and the second bracket comprises at least one pin assembly comprising at least a first pin and a second pin that is movable relative to the first pin.

6. The slide assembly of claim 5, wherein the second pin surrounds and is carried by the first pin.

7. The slide assembly of claim 5, further comprising a third pin that is movable relative to both the first pin and the second pin.

8. The slide assembly of claim 5, wherein the first bracket comprises a first latch and the second bracket comprises a second latch, wherein each of the first latch and the second latch is rotatable relative to the first bracket and the second bracket, respectively, about an axis defined by a pivot pin, wherein each of the first latch and the second latch is supported by the respective pivot pin at spaced locations defining a height that is substantially equal to a height of the first latch and the second latch, respectively.

9. The slide assembly of claim 1, wherein the inner slide segment comprises a plurality of slots configured to receive mounting pins of a computer server.

10. The slide assembly of claim 9, wherein the inner slide segment is removable from the at least one intermediate slide segment.

11. The slide assembly of claim 9, wherein the inner slide segment is not removable from the at least one intermediate slide segment.

12. The slide assembly of claim 1, wherein the inner slide segment comprises a plurality of keyholes configured to receive mounting pins of a computer server.

13. The slide assembly of claim 12, wherein the inner slide segment is removable from the at least one intermediate slide segment.

14. The slide assembly of claim 1, further comprising a lock arrangement configured to secure the inner slide segment in an open position relative to the intermediate slide segment, the lock arrangement comprising at least one latch comprising a bent metal member and an actuation member coupled to the bent metal member.

15. The slide assembly of claim 14, further comprising a biasing member that engages the actuation member.

16. A slide assembly, comprising:
an outer slide segment constructed from a bent piece of material having a single wall thickness, the outer slide segment having a wall portion, an upper portion and a lower portion, wherein the upper and lower portions are separated from one another by the wall portion and each of the upper and lower portions define a bearing surface, wherein each of the upper and lower portions comprise two layers of the piece of material such that an effective wall thickness of the upper and lower portions is greater than a wall thickness of the wall portion extending between the upper and lower portions;
at least one intermediate slide segment telescopically engaged with the outer slide segment, the at least one intermediate slide segment having a first bearing surface and a second bearing surface;
an inner slide segment telescopically engaged with the at least one intermediate slide segment, the inner slide segment having a first bearing surface and a second bearing surface;
wherein the first and second bearing surfaces of each slide segment carry a load applied by the other slide segments;
a lock arrangement configured to secure the inner slide segment in an open position relative to the intermediate slide segment, the lock arrangement comprising at least one latch and a release mechanism configured to actuate the at least one latch, wherein the release mechanism comprises a lever arm and a finger latch comprising a finger grip portion, wherein the finger latch is a separate component from the lever arm, and wherein the finger latch is positioned and retained between the lever arm and the inner slide segment, and wherein the release mechanism comprises a biasing arrangement extending between a tab of the inner slide segment and the finger latch, wherein the finger latch covers the tab and the biasing arrangement, the biasing arrangement configured to bias the release mechanism toward a neutral position,
wherein the lever arm covers a portion of the finger latch such that the lever arm defines an outermost surface facing away from the inner slide segment along the portion.

17. The slide assembly of claim 16, wherein the biasing arrangement comprises a first spring and a second spring.

18. The slide assembly of claim 16, wherein the lever arm is coupled to the inner slide segment on each side of the finger latch at a location aligned with the finger latch in a longitudinal direction of the slide assembly.

19. A slide assembly, comprising:
an outer slide segment constructed from a bent piece of material having a single wall thickness, the outer slide segment having a wall portion, an upper portion and a lower portion, wherein the upper and lower portions are separated from one another by the wall portion and each of the upper and lower portions define a bearing surface, wherein each of the upper and lower portions comprise two layers of the piece of material such that an effective wall thickness of the upper and lower portions is greater than a wall thickness of the wall portion extending between the upper and lower portions;
at least one intermediate slide segment telescopically engaged with the outer slide segment, the at least one intermediate slide segment having a first bearing surface and a second bearing surface;
an inner slide segment telescopically engaged with the at least one intermediate slide segment, the inner slide segment having a first bearing surface and a second bearing surface;
wherein the first and second bearing surfaces of each slide segment carry a load applied by the other slide segments;
a lock arrangement configured to secure the inner slide segment in an open position relative to the intermediate slide segment, the lock arrangement comprising a first latch and a second latch, wherein the first latch only regulates retraction of the inner slide segment relative to the intermediate slide segment and the second latch only regulates removal of the inner slide segment from the intermediate slide segment, wherein the second latch comprises a resilient lock arm that moves in a lateral direction of the slide assembly, transverse to a longitudinal axis of the inner slide segment, between a locked position that prevents removal of the inner slide segment and an unlocked position that permits removal of the inner slide segment;
a bearing assembly interposed between the inner slide segment and the intermediate slide segment, wherein the bearing assembly comprises a ball retainer and the intermediate slide segment comprises a ball retainer hold forward lock arm that engages the ball retainer, wherein a portion of the resilient lock arm of the second latch is capable of releasing the ball retainer hold forward lock arm.

20. The slide assembly of claim 19, further comprising an actuator for the second latch, wherein the actuator is carried by the intermediate slide segment and comprises a touch point portion that is accessible from an outside of the intermediate slide segment and, when actuated, extends through a window in the intermediate slide segment to move the second latch.

21. The slide assembly of claim 20, wherein the actuator for the second latch further comprises a lead-in guide for the inner slide segment.

\* \* \* \* \*